United States Patent [19]
Nakura et al.

[11] Patent Number: 6,101,233
[45] Date of Patent: Aug. 8, 2000

[54] COUNTER CIRCUIT

[75] Inventors: Toru Nakura; Kimio Ueda, both of Tokyo, Japan

[73] Assignee: Mitsubishi Denki Kabushiki Kaisha, Tokyo, Japan

[21] Appl. No.: 09/146,334

[22] Filed: Sep. 2, 1998

[30] Foreign Application Priority Data

May 20, 1998 [JP] Japan .................................. P10-138333

[51] Int. Cl.[7] ..................................................... H03K 21/08
[52] U.S. Cl. ............................. 377/114; 377/28; 377/116
[58] Field of Search ............................... 377/28, 114, 116

[56] References Cited

U.S. PATENT DOCUMENTS

| 4,394,769 | 7/1983 | Lull | 377/116 |
| 4,493,095 | 1/1985 | Yazawa | 377/107 |
| 4,516,251 | 5/1985 | Gallup | 377/110 |

FOREIGN PATENT DOCUMENTS 3-263920  11/1991  Japan .

OTHER PUBLICATIONS

Noboru Ishihara, et al., "3.5Gb/s×4–Ch Si Bipolar LSIs for Optical Interconnections", 1995 IEEE International Solid–State Circuits Conference, Digest of Technical Papers, pp. 34–35.

Phuc C. Pham, et al., "A 2.5Gb/s 32:1/1:32 Sonet Mux/Demux Chip Set", 1996 IEEE International Solid–State Circuits Conference, Digest of Technical Papers, pp. 120–121.

*Primary Examiner*—Margaret R. Wambach
*Attorney, Agent, or Firm*—Oblon, Spivak, McClelland, Maier & Neustadt, P.C.

[57] ABSTRACT

Counter circuits causing no noise at the time of operation are provided. Three stage of D-type flip-flops (FF1 to FF3) are connected in series. A delay element (11) delays a signal (S2) that is Q output of the flip-flop (FF1) by a delay time (d2) to output a delay signal (S2D), and a delay element (12) delays a signal (S3) that is Q output of the flip-flop (FF2) by a delay time (d3) to output a delay signal (S3D). Here, the relationship among the delay time (d2, d3) and a clock cycle (Tc) is set so as to satisfy the condition of {Tc>d2>d3}. NOR gate for three inputs (G1) receives delay signals (S2D, S3D) and a signal (S4) i.e., Q output of the flip-flop (FF3), and performs NOR operation on these signals (S2D, S3D and S4), thereby outputting a signal (S1) to D input of the flip-flop (FF1).

19 Claims, 17 Drawing Sheets d2 > Tc > d3

$2Tc > d2 > d3 > Tc$

COUNTER CIRCUIT

BACKGROUND OF THE INVENTION

1. Field of the Invention

The present invention relates to a counter circuit of digital transmission circuits and more particularly to a technique for reducing noise at the time of operation.

2. Description of the Background Art

FIG. 21 is a circuit diagram of a conventional counter circuit structure. In FIG. 21 three stages of D-type flip-flops FF1 to FF3 which receive a clock CLK in common at their C (clock) inputs, are connected in series. The D-type flip-flop FF1 receives a signal S1 at its D input and outputs a signal S2 from its Q output, the D-type flip-flop FF2 receives the signal S2 at its D input and outputs a signal S3 from its Q output, and the D-type flip-flop FF3 receives the signal S3 at its D input and outputs a signal S4 from its Q output.

NOR gate G10 for three inputs receives signals S2 to S4 and performs NOR operation on the signals S2 to S4, to output a signal S1.

FIG. 22 is a timing chart showing the operation of the counter circuit of FIG. 21. D-type flip-flops FF1 to FF3 latch signals given to their respective D inputs by using the rising edge of a clock CLK as a trigger. Therefore, every clock cycle Tc, the content latched by a D-type flip-flop is transported to the following D-type flip-flop.

When signals S2 to S4 are all "L", a signal S1 becomes "H" by the NOR gate G10. As shown in FIG. 22, the signal of "H" cycles every clock cycle Tc in the order of signals S1, S2, S3, S4, S1 . . . , so that each of the signals S1 to S4 becomes "H" once every four times of the clock cycle Tc of a clock CLK.

Accordingly, the pulse number of a clock CLK, i.e., 4N, is countable by counting the number "N" of how frequently any one of signals S1 to S4 becomes "H". Since the pulse number "4" is countable at a time, the counter circuit with the structure of FIG. 21 is referred to as "4-bit counter circuit."

Unfortunately, when on the above counter circuit the "H" of a signal S2 is transported to a signal S3 between the D-type flip-flops FF1 and FF2, there exists a momentary period that both of the signals S2 and S3 become "L" between the flip-flops FF2 and FF3. Thus, when the "H" of the signal S2 is transported to the signal S3, there exists a momentary period that the signals S2 to S4 are all "L", and hence a spike shaped noise NZ occurs in a signal S1. The same is true for the moment that the "H" of a signal S3 is transported to a signal S4.

As stated above, in the conventional counter circuit there is the danger that the counter circuit will cause a malfunction due to the noise generated in the signal S1.

SUMMARY OF THE INVENTION

According to a first aspect of the present invention, a counter circuit comprises: first to Nth (N≧2) flip-flops connected in series between I/O from the first to Nth flip-flops, each operating in synchronization with a predetermined clock given in common; and a logical operation means with a delay function which receives first to Nth output signals as the respective output signals of the first to Nth flip-flops, performs logical operations based on judgements as to whether the first to Nth output are all a first fixed value to output a logical result output signal to an input section of the first flip-flop, the first to Nth output signals being propagated through a predetermined signal path group so as to have descending signal propagation delay time in the order of first to Nth output signals.

According to a second aspect of the invention, the counter circuit of the first aspect is characterized in that the logical operation means with a delay function comprises: first to Nth delay means that delay the first to Nth output signals by first to Nth delay time, respectively, to output first to Nth delay output signals, the first to Nth delay time being set in the order descending, starting with first and following through Nth, the Nth delay time including "0"; and a logical result output means that receives the first to Nth delay output signals and performs logical operations based on judgements as to whether the first to Nth delay output signals are all the first fixed value, to output the logical result output signal to the input section of the first flip-flop.

According to a third aspect of the invention, the counter circuit of the second aspect is characterized in that the logical result output means includes a means that further receives the first output signal and performs logical operations based on judgements as to whether the first to Nth delay output signals and the first output signal are all the first fixed value, to output the logical result output signal.

According to a fourth aspect of the invention, the counter circuit of the third aspect is characterized in that the first delay time is shorter than the predetermined clock cycle.

According to a fifth aspect of the invention, the counter circuit of the third aspect is characterized in that the first delay time is longer than the predetermined clock cycle and the second delay time is shorter than the predetermined clock cycle.

According to a sixth aspect of the invention, the counter circuit of the third aspect is characterized in that the first delay time is shorter than the twice the predetermined clock cycle.

According to a seventh aspect of the invention, the counter circuit of the first aspect is characterized in that the logical operation means with a delay function comprises: a first delay means that delays the first output signal by a first delay time to output a first delay output signal; second to (N–1)th delay means that perform logical operations based on second to (N–1)th fixed values and delay the second to (N–1)th output signals by second to (N–1)th delay time, respectively, to output second to (N–1)th delay output signals, ith (i=any one of 2 to (N–1)) delay means performing logical operations based on judgements as to whether (i–1)th delay output signal and ith output signal are both ith fixed value; and a logical result output means that receives the (N–1)th delay output signal and Nth output signal and performs logical operations based on judgments as to whether both are a first fixed value, to output the logical result output signal to the input section of the first flip-flop.

According to an eighth aspect of the invention, the counter circuit of the seventh aspect is characterized in that the logical result output means includes a means that further receives the first output signal and performs logical operations based on judgements as to whether the (N–1)th delay output signal, the Nth delay output signal and the first output signal are all the first fixed value, to output the logical result output signal.

According to a ninth aspect of the invention, the counter circuit of the eighth aspect is characterized in that N is equal to 3; the first delay means includes two stages of inverters connected in series, signal propagation time of the inverters being defined as the first delay time; the second delay means includes an OR gate whose signal propagation time is defined as the second delay time, and the second fixed value includes "0"; and the logical result output means includes a NOR gate and the first fixed value includes "0".

According to a tenth aspect of the invention, the counter circuit of the eighth aspect is characterized in that: each input section and output section of the first to Nth flip-flops include non-inverted and inverted input sections and non-inverted and inverted output sections, respectively; jth (j=1 to N) output signal includes one of ith non-inverted output signal from the non-inverted output section of jth flip-flop and ith inverted output signal from the inverted output section of the jth flip-flop; and the logical result output signal includes one of a non-inverted logical result output signal to be outputted to the non-inverted input section of the first flip-flop and an inverted logical result output signal to be outputted to the inverted input section of the first flip-flop.

According to an eleventh aspect of the invention, the counter circuit of the tenth aspect is characterized in that in the first to Nth non-inverted output signals and the first to Nth inverted output signals, one of the jth (j=1 to N) non-inverted output signal and the jth inverted output signal which is capable of reducing the number of elements, is employed as the jth output signal.

According to a twelfth aspect of the invention, the counter circuit of the eleventh aspect is characterized in that: N is equal to 3; the first output signal includes a first non-inverted output signal, the second output signal includes a second inverted output signal, the third output signal includes a third non-inverted output signal, and the logical result output signal includes the non-inverted logical result output signal; the first delay means includes a first stage inverter whose signal propagation time is defined as the first delay time; the second delay means includes a NAND gate whose signal propagation time is defined as the second delay time, and the second fixed values includes "1"; and the logical result output means includes a NOR gate and the first fixed value includes "0".

According to a thirteenth aspect of the invention, the counter circuit of the eleventh aspect is characterized in that: N is equal to 3; the first output signal includes a first inverted output signal, the second output signal includes a second non-inverted output signal, the third output signal includes a third inverted output signal, and the logical result output signal includes the inverted logical result output signal; the first delay means includes a first stage inverter whose signal propagation time is defined as the first delay time; the second delay means includes a NOR gate whose signal propagation time is defined as the second delay time, and the second fixed values includes "0"; and the logical result output means includes a NAND gate and the first fixed value includes "1".

In the counter circuit of the first aspect, the logical operation means with a delay function performs the logical operation based on judgements as to whether all the first to Nth output signals of the first to Nth flip-flops which have been propagated through a predetermined signal path group so as to have decreasing signal propagation delay time in the order of first to Nth output signals, become a first fixed value, to output a logical result output signal.

Therefore, when the active value determined in connection with the first fixed value is transported between adjacent the kth (K=1 to (N-1)) and the (k+1)th flip-flops of the first to Nth flip-flops, a difference in signal propagation time will ensure that a duplicate period of the active value is set between the kth and (k+1)th output signals after being propagated through a predetermined signal path group.

As a result, there exists no period that both output signals become the first fixed value when the active value is transported between adjacent flip-flops. Hence, the logical result output signal is free from noise and thus there is no danger of malfunction.

In the counter circuit of the second aspect, the first to Nth delay means delay the first to Nth output signals by the first to Nth delay time to output the first to Nth delay output signals, and the logical result output means performs the logical operations based on judgements as to whether all the first to Nth delay output signals are the first fixed value, to output its logical result output signal.

Therefore, the first to Nth delay output signals can have a phase difference in a comparatively easy way as by setting in the order of descending delay time, starting with the first and following through the Nth.

In the counter circuit of the third aspect, the logical result output means includes the means that performs the logical operations based on judgements as to whether all the first to Nth delay output signals and the first output signal are the first fixed value, to output its logical result output signal to the input section of the first flip-flop.

Therefore, irrespective of the first delay time for the first delay output signal, the logical result output means can change the logical result output signal from the active value to the first fixed value by employing the moment the first output signal changes to the active value, as a trigger. This enables a stable operation and to respond to the high-speed of a predetermined clock.

In the counter circuit of the fourth aspect, since the first delay time is shorter than a predetermined clock cycle, the first to Nth delay output signals will not be delayed from their respective first to Nth output signals beyond the cycle, so that the logical result output signal and the first to Nth output signals are unaffected by the first to Nth delay output signals.

Therefore, it is possible to count the pulse number of a predetermined clock by using an arbitrary signal taken from among the logical result output signal and the first to Nth output signals.

In the counter circuit of the fifth aspect, since the second delay time is shorter than a predetermined clock cycle, the first to Nth output signals are unaffected by the first delay output signal which has been delayed by a first delay time longer than the cycle. Therefore, it is possible to count the pulse number of a predetermined clock by using an arbitrary signal taken from among the first to Nth output signals.

In the counter circuit of the sixth aspect, since the first delay time is shorter than the twice a predetermined clock cycle, the first to Nth output signals are unaffected by the first to Nth delay output signals even if each of the first to Nth delay time is longer than the cycle.

In the counter circuit of the seventh aspect, ith (i=any one of 2 to (N-1)) delay means performs the logical operations based on judgements as to whether both of the (i-1)th delay output signal and the ith output signal become the ith fixed value, and delays it by the ith delay time, thereby outputting the ith delay output signal.

Thus, the second to (N-1)th delay means can also perform the logical operation. An efficient combination of the second to (N-1)th delay means will make it easy to reduce the number of elements required for circuit configuration.

In addition, since the ith output signal is passed through the ith to (N-1)th delay means, irrespective of the setting time of the first to (N-1)th delay time, the first to Nth output signals are finally propagated to the logical result output means in the order to descending signal propagation delay time, starting with the first and following through the Nth. This lessens the restriction on the first to (N−1)th delay time, making it possible to reduce the number of elements required for circuit configuration.

In the counter circuit of the eighth aspect, the logical result output means performs the logical operations based on judgements as to whether all of the (N−1)th delay output signal, Nth output signal and the first output signal are a first fixed value, to output its logical result output signal.

Therefore, irrespective of the first delay time for the first delay output signal, the logical result output means can change the logical result output signal from the active value to the first fixed value by employing the moment the first output signal changes to the active value, as a trigger. This enables a stable operation and to respond to the high-speed of a predetermined clock.

The counter circuit of the ninth aspect is characterized in that N is equal to 3, the first delay means includes two stages of inverters connected in series, the second delay means includes an OR gate, the second fixed value includes "0", and the logical result output means includes a NOR gate.

Therefore, the number of transistors of CMOS structure that are required for the first and second delay means and the logical result output means, can be reduced to 16.

In the counter circuit of the tenth aspect, the jth (j=1 to N) output signal of the jth flip-flops includes either the ith non-inverted output signal from the non-inverted output section or the ith inverted output signal from the inverted output section, and the logical result output signal includes either the non-inverted logical result output signal to be outputted to the non-inverted input section of the first flip-flop or the inverted logical result output signal to be outputted to the inverted input section of the first flip-flop. It is therefore possible to configure a counter circuit with the first to Nth flip-flops having a complementary I/O function.

In the counter circuit of the eleventh aspect, either the jth (j=1 to N) non-inverted output signal or the jth inverted output signal, which is capable of reducing the number of elements, is employed as the jth output signal, resulting in a simple circuit structure.

The counter circuit of the twelfth aspect wherein N is equal to 3; the first output signal includes the first non-inverted output signal, the second output signal includes the second inverted output signal, the third output signal includes the third non-inverted output signal, and the logical result output signal includes the non-inverted logical result output signal; the first delay means includes one stage inverter; the second delay means includes a NAND gate; and the logical result output means includes a NOR gate, can produce the advantage that the number of transistors of CMOS structure that are required for the first and second delay means and a logical result output means, is reduced to 12.

The counter circuit of the thirteenth aspect wherein N is equal to 3; the first output signal includes the first inverted output signal, the second output signal includes the second non-inverted output signal, the third output signal includes the third inverted output signal, and the logical result output signal includes the inverted logical result output signal; the first delay means includes one stage inverter; the second delay means includes a NOR gate; and the logical result output means includes a NAND gate, can produce the advantage that the number of transistors of CMOS structure that are required for the first and second delay means and the logical result output means, is reduced to 12.

An object of the present invention is to provide a counter circuit that causes no noise at the time of operation.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
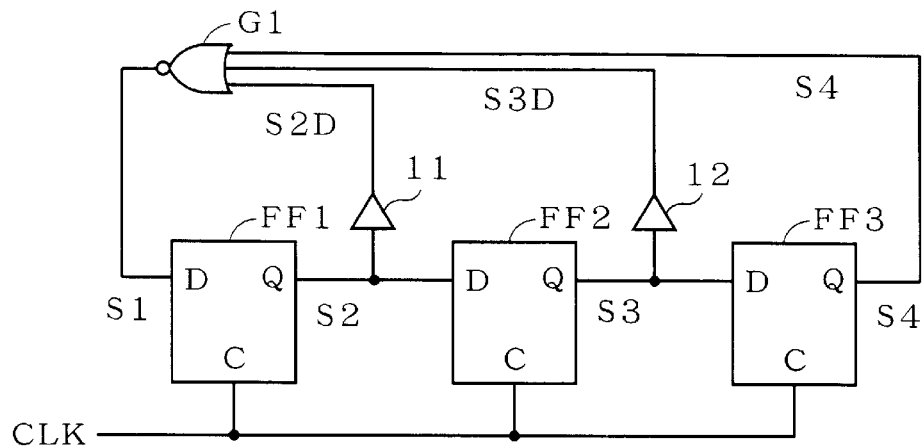
FIG. 1 is a circuit diagram of the a counter circuit structure according to a first preferred embodiment of the present invention.

FIG. 1 is a circuit diagram showing a counter circuit structure according to a first preferred embodiment of the present invention. As shown in FIG. 1, three stages of D-type flip-flops FF1 to FF3 which receive a clock CLK in common at their C (clock) inputs, are connected in series. Specifically, the D-type flip-flop FF1 receives a signal S1 at its D input and outputs a signal S2 from its Q output, the D-type flip-flop FF2 receive the signal S2 at its D input and outputs a signal S3 from its Q output, and the D-type flip-flop FF3 receives the signal S3 at its D input and outputs a signal S4 from its Q output.

A delay element 11 delays the signal S2 by a delay time d2 to output a delay signal S2D. A delay element 12 delays the signal S3 by a delay time d3 to output a delay signal S3D. Here, the relationship among delay time d2, d3, and a clock cycle Tc, is set so as to satisfy the condition of {Tc>d2>d3}.

NOR gate G1 for three inputs receives the delay signals SD2, S3D and S4 and performs NOR operation on the signals SD2, S3D and S4, to output a signal S1.

Figure 2:
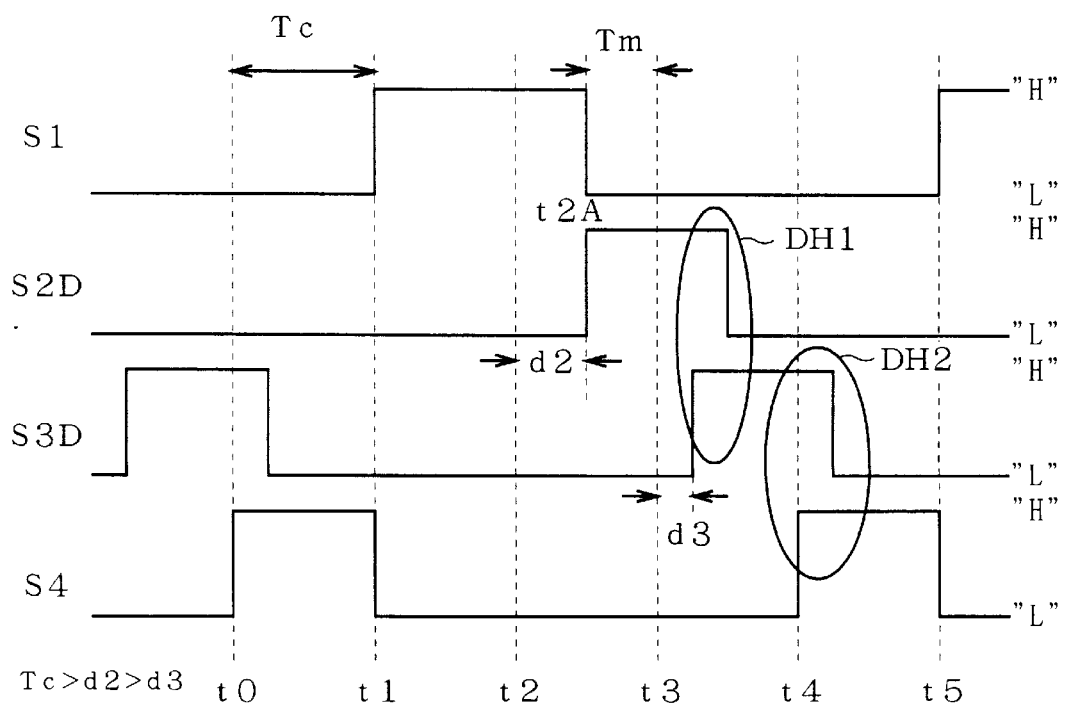
FIG. 2 is a timing chart showing the operation of the counter circuit of the first preferred embodiment.

FIG. 2 is a timing chart showing the operation of the counter circuit of the first preferred embodiment. In FIG. 2, time t0 to t5 denote the respective rise time of a clock CLK, and Tc denotes a clock cycle.

A delay signal S2D becomes "H" at time t2A after a delay time d2 has lapsed since time t2 at which a signal S2 (not shown) rises to "H", thereafter, maintains "H" during a clock cycle Tc. A delay signal S3D becomes "H" after a delay time d3 has lapsed since time t3 at which a signal S3 (not shown) rises to "H", thereafter, maintains "H" during a clock cycle Tc. A signal S4 becomes "H" at time t4 and maintains "H" until time t5.

When the signals S2D, S3D and S4 are all "L", the signal S1 becomes "H". Therefore, as shown in FIG. 2, the signal of "H" that is an active value cycles every clock cycle Tc in the order of signals S1, S2, S3, S4, S1 . . . , so that each of the signals S1 to S4 becomes "H" once every four times of the clock cycle Tc of the clock CLK. Here, the "H" period of the signal S1 results in (Tc+d2).

That is, the pulse number of a clock CLK, i.e., 4N, is countable by counting the number "N" of how frequently any one of signals S1 to S4 becomes "H". Thus, the counter circuit of the first preferred embodiment has a 4-bit counter function with which the pulse number of "4" can be counted at a time.

Suppose that a signal S4 is a delay signal of a delay time "0", the relationship {Tc>d2>d3>0} is established. Accordingly, an "H" duplicate period DH1 due to the phase difference of (d2−d3) is always present between the delay signals S2D and S3D, and an "H" duplicate period DH2 due to the phase difference of d2 is always present between the delay signals S3D and the signal S4.

Thus, when the "H" of the signal S2 that is Q output of the D-type flip-flop FF1 is taken in the D input of the D-type flip-flop FF2 and then transmitted to the signal S3 of the D-type flip-flop FF2, there exists no period that the signals S2D and S3D are both "L", because of the presence of the duplicate period DH1.

As a result, there exists no period that the signals S2D, S3D and S4 are all "L" when the "H" of the signal S2 is transmitted to the signal S3, thus causing no spike shaped noise in the signal S1. The same is true for the case where the "H" of the signal S3 is transmitted to the signal S4.

As set forth above, the counter circuit of the first preferred embodiment provides the effects that the signal S1 is free from noise and hence there is no danger of malfunction.

Second Preferred Embodiment

[First Aspect]

Figure 3:
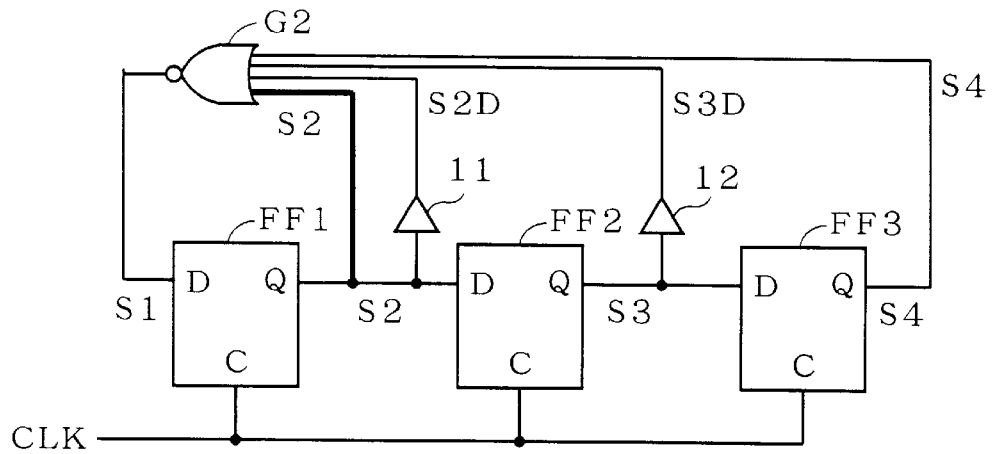
FIG. 3 is a circuit diagram of a counter circuit structure according to a second preferred embodiment.

FIG. 3 is a circuit diagram showing a counter circuit structure of a first aspect of a second preferred embodiment. Most part of this structure is the same as that of FIG. 1 in the first preferred embodiment. The differences displayed by the two structures are as follows.

In place of the NOR gate G1 for three inputs, a NOR gate G2 for four inputs is employed which further receives a signal S2 in addition to delay signals S2D, S3D and S4, and performs NOR operation on the signals S2, S2D, S3D and S4, to output a signal S1.

A delay element 11 delays a signal S2 by a delay time d2 to output a delay signal S2D, and a delay element 12 delays a signal S3 by a delay time d3 to output a delay signal S3D. Here, delay time d2 and d3 are set such that the relationship among the delay time d2, d3, and a clock cycle Tc, satisfies the condition of {Tc>d2>d3}, as in the first preferred embodiment.

Figure 4:
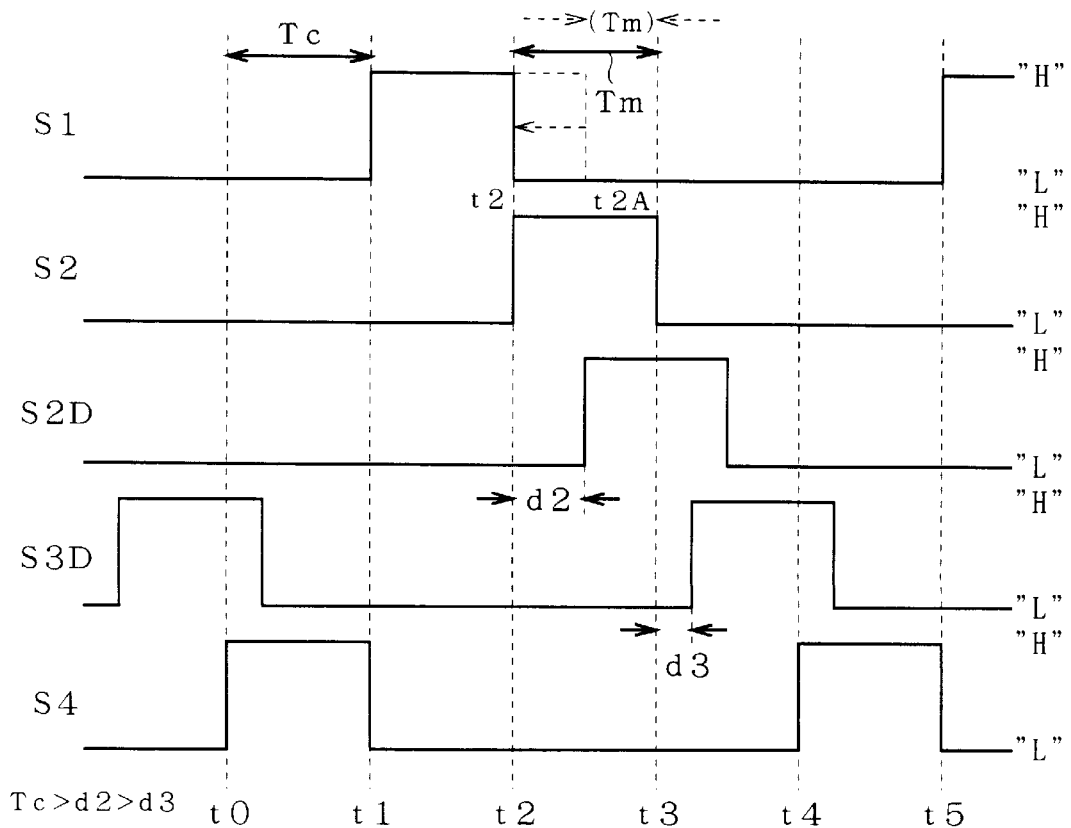
FIG. 4 is a timing chart showing a counter circuit operation of a first aspect of the second preferred embodiment.

FIG. 4 is a timing chart showing the operation of the counter circuit of the first aspect of the second preferred embodiment. In FIG. 4, time t0 to t5 denote the respective rise time of a clock CLK, and Tc denotes a clock cycle.

As shown in FIG. 4, the waveforms of signals S2, S2D, S3D and S4 are similar to those of FIG. 2 in the first preferred embodiment, and this counter circuit has a 4-bit count function. However, the waveform of the signal S1 is different.

As in the first preferred embodiment, there exists no period that the signals S2, S2D, S3D and S4 are all "L" when the "H" of the signal S2 is transmitted to the signal S3. Therefore, in the first aspect of the second preferred embodiment, no spike shaped noise occurs in the signal S1. The same is true for the case where the signals S3 is transmitted to the signal S4.

As set forth above, the counter circuit of the second preferred embodiment provides the effects that the signal S1 is free from noise and hence there is no danger of malfunction.

The distinguishing feature of the first aspect of the second preferred embodiment over the first preferred embodiment will be described as below.

The signal S1 outputted from the NOR gate G2 becomes "H" when signals S2, S2D, S3D and S4 are all "L", so that the "H" period of a signal S1 becomes a clock cycle Tc.

Since in the counter circuit of the first preferred embodiment the period from time t1 to time t2A is "H", there is no margin in a timing margin Tm until time t3 at which a signal S1 should be "L" (see the arrows by broken line in FIG. 4). Lack of the timing margin Tm will involve the danger that the signal S1 being the output of the NOR gate G1 does not normally fall to "L" until time t3, making it difficult to secure a stable operation.

On the other hand, since in the first aspect of the second preferred embodiment, the period from time t1 to t2 is "H", a timing margin Tm until time t3 at which a signal S1 should be "L" becomes a clock cycle Tc, resulting in a sufficient margin (see the arrows by solid line in FIG. 4). The presence of a sufficient timing margin Tm ensures that the signal S1 being the output of the NOR gate G2 falls to "L" until time t3, thus permitting a stable operation.

As set forth above, the first aspect of the second preferred embodiment produces more stable operation than the first preferred embodiment. It is therefore possible to respond to a high-speed clock CLK and hence serve as a counter circuit more suitable for semiconductor devices of SOI structure.

[Second Aspect]

In the first aspect delay time d2 and d3 are set such that the relationship among delay time d2, d3, and a clock cycle Tc, satisfies the condition of {Tc>d2>d3}. Whereas in a second aspect, the delay time d2 and d3 are set such that the relationship among delay time d2, d3, and a clock cycle Tc, satisfies the condition of {d2>Tc>d3}. The structure is the same as that of FIG. 3 in the first aspect, except for the delay time d2 and d3 of delay elements 11 and 12, respectively.

Figure 5:
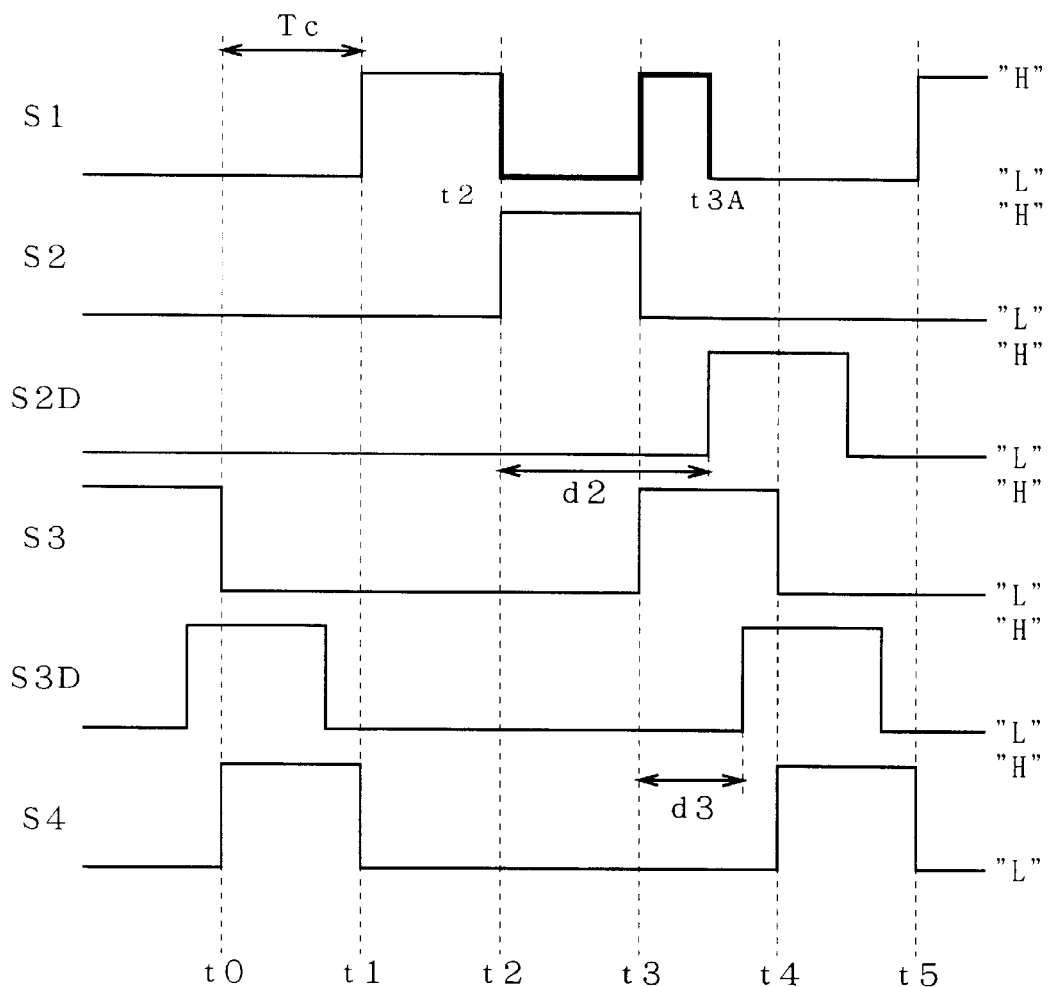
FIG. 5 is a timing chart showing a counter circuit operation of a second aspect of the second preferred embodiment.

FIG. 5 is a timing chart showing the operation of a counter circuit of the second aspect according to the second preferred embodiment. In FIG. 5, time t0 to t5 denote the respective rise time of a clock CLK, and Tc denotes a clock cycle.

As shown in FIG. 5, the waveforms of signals S2, S2D, S3D and S4 are similar to those of FIG. 4 in the first preferred embodiment, and this counter circuit has a 4-bit count function. However, the waveform of a signal S1 is different.

Since the delay time d2 is longer than the clock cycle Tc, there exists the period that the signals S2, S2D, S3D and S4 are all "L", from time t3 at which the signal S3 rises to "H" to time t3A (t3+(d2−Tc)), so that the signal S1 becomes "H".

On the other hand, since the delay time d3 is shorter than the clock cycle Tc, time t3A always precedes time t4, and the signal S1 always falls to L" until time t4, thereby exerting no adverse effect on the signals S2 to S4. Although in FIG. 5 the rise time of the delay signal S2D is time t3A, even if the delay time d2 is more than 2·Tc, the delay signal S3D precedes time t4 and hence time t3A (the delay signal S2D or S3D which has the earlier rise time) does not follow after time t4.

Accordingly, the pulse number 4N of a clock CLK is countable by counting the number N of how frequently any one of signals S2 to S4 except for a signal S1 becomes "H".

[Third Aspect]

In a third aspect, delay time d2 and d3 are set so that the relationship among the delay time d2, d3, and a clock cycle Tc, satisfies the condition of {2Tc>d2>d3>Tc}. The structure is the same as that of FIG. 3 in the first aspect, except for the delay time d2 and d3 of delay elements 11 and 12, respectively.

Figure 6:
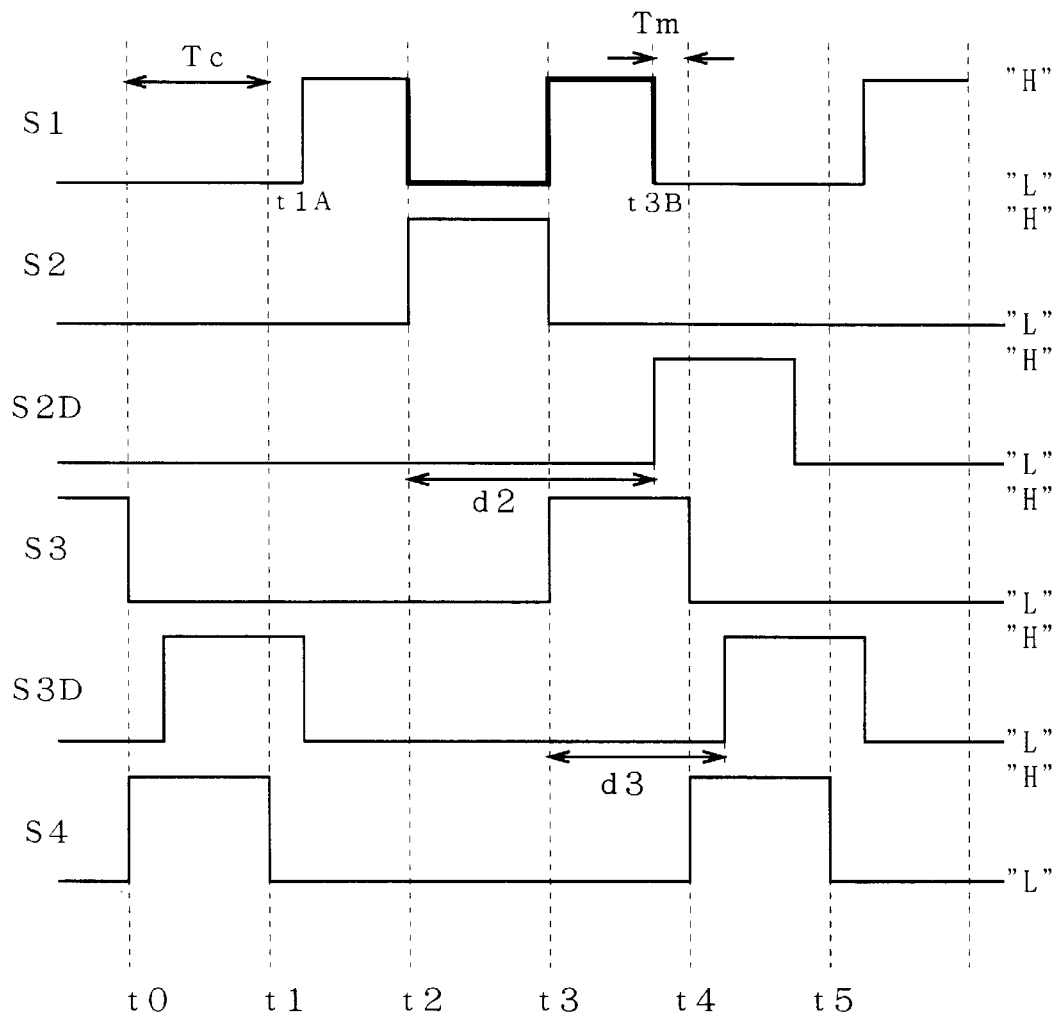
FIG. 6 is a timing chart showing a counter circuit operation of a third aspect of the second preferred embodiment.

FIG. 6 is a timing chart showing the operation of a counter circuit of the third aspect according to the second preferred embodiment. In FIG. 6, time t0 to t5 denote the respective rise time of a clock CLK, and Tc denotes a clock cycle.

As shown in FIG. 6, the waveforms of signals S2, S2D, S3D and S4 are similar to those of FIG. 5 in the second aspect, and this counter circuit has a 4-bit count function. However, the waveform of a signal S1 is different.

Since the delay time d2 is longer than the clock cycle Tc, there exists the period that the signals S2, S2D, S3D and S4 are all "L" from time t3 to time t3B (t3+(d2−Tc)), so that a signal S1 becomes "H". In addition, since the delay time d3 is also longer than the clock cycle Tc, the "H" period of a signal S1, which exists from time t1 to t2 in the first and second aspect, is narrowed to from time t1A (t1+(d3−Tc)) to t2.

However, since the delay time d2 is shorter than the twice a clock cycle, i.e., 2·Tc, time t3B precedes time t4 and a signal S1 always falls to "L" until time t4, thus exerting no adverse effect on signals S2 to S4.

In addition, the delay time d3 is shorter than the twice a clock cycle, i.e., 2·Tc, time t1A precedes time t2, and a signal S1 always rises to "H" until time t2, thus exerting no adverse effect on signals S2 to S4.

Accordingly, the pulse number 4N of a clock CLK is countable by counting the number N of how frequently any one of signals S2 to S4 except for a signal S1 becomes "H".

[Concrete Structure]

Figure 7:
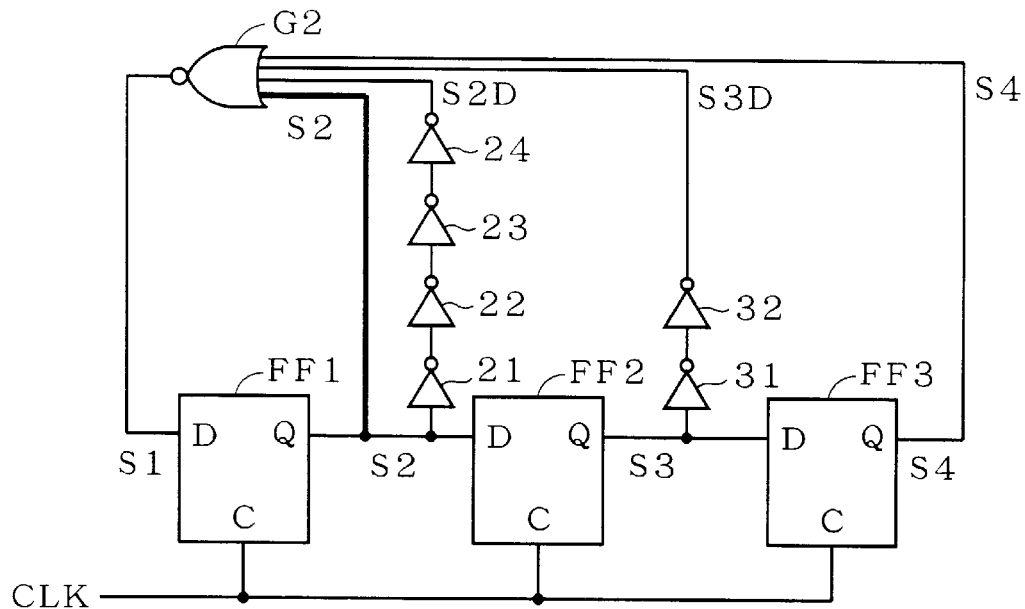
FIG. 7 is a circuit diagram showing a concrete counter circuit structure in the second preferred embodiment.

FIG. 7 is a circuit diagram showing a concrete structure of the counter circuit according to the second preferred embodiment. In FIG. 7, there are provided four stages of inverters 21 to 24 connected in series as a delay element 11, and two stages of inverters 31 and 32 connected in series as a delay element 12. With this structure, suppose that each of the inverters 21 to 24, and 31, 32 has a delay time Δt, it follows that a delay time d2=4·Δt and a delay time d3=2·Δt. This satisfies the condition d3>d2, which is common to the first to third aspects.

In the circuit structure shown in FIG. 7, the number of transistors of CMOS structure required in the logical circuit portions is: 12 (2×6) are for the inverters 21 to 24, and 31, 32; and 8 are for the NOR gate G2 for four inputs, thus summing up to 20.

Third Preferred Embodiment

[First aspect]

(A) Basic Structure

Figure 8:
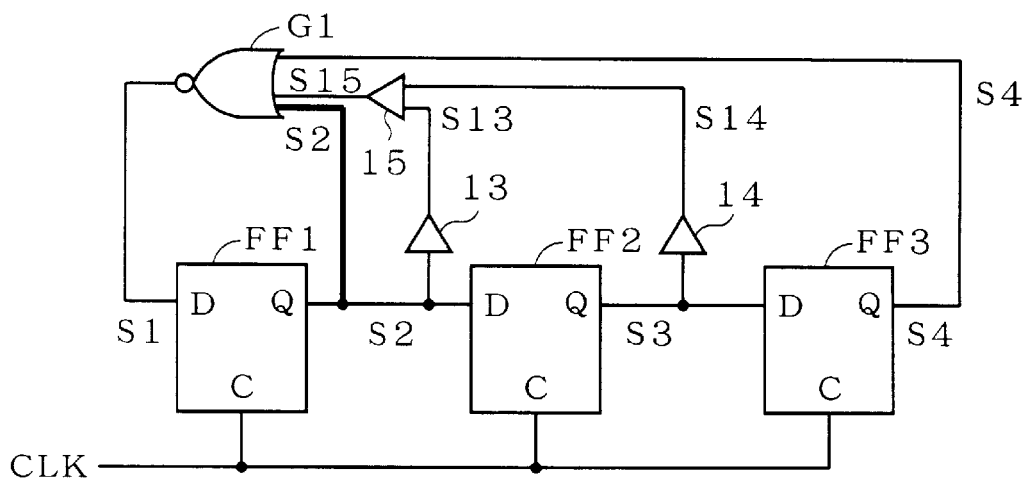
FIG. 8 is a circuit diagram showing a counter circuit structure according to a first aspect of a third preferred embodiment.

FIG. 8 is a circuit diagram showing a basic structure of a third preferred embodiment. This structure is similar to that of FIG. 3 in the second preferred embodiment, except that the delay elements 11 and 12 are replaced by delay elements 13 to 15, and the NOR gate G2 for four inputs is replaced by a NOR gate G1 for three inputs.

The delay element 13 delays a signal S2 by a delay time d13 to output a signal S13, and the delay element 14 delays a signal S3 by a delay time d14 (<d13) to output a signal S14. The delay element 15 receives the signals S13 and S14, performs a predetermined logical operation on the signals S13 and S14, and delays its logical result by a delay time d15 to output it as a signal S15. In this case, the delay element 15 outputs the signal S15 that becomes "L" when the signals S2 and S3 are both "L", or becomes "H" in other cases.

The NOR gate G1 for three inputs receives signals S2, S15 and S4 and performs NOR operation on the signals S2, S15 and S4, to output a signal S1.

With this structure, the counter circuit of the first aspect of the third preferred embodiment provides an operation equivalent to the counter circuit of FIG. 3 in the second preferred embodiment, when a delay time d2=d13+d15 and a delay time d3=d14+d15<d2.

(B) Concrete Structure

Figure 9:
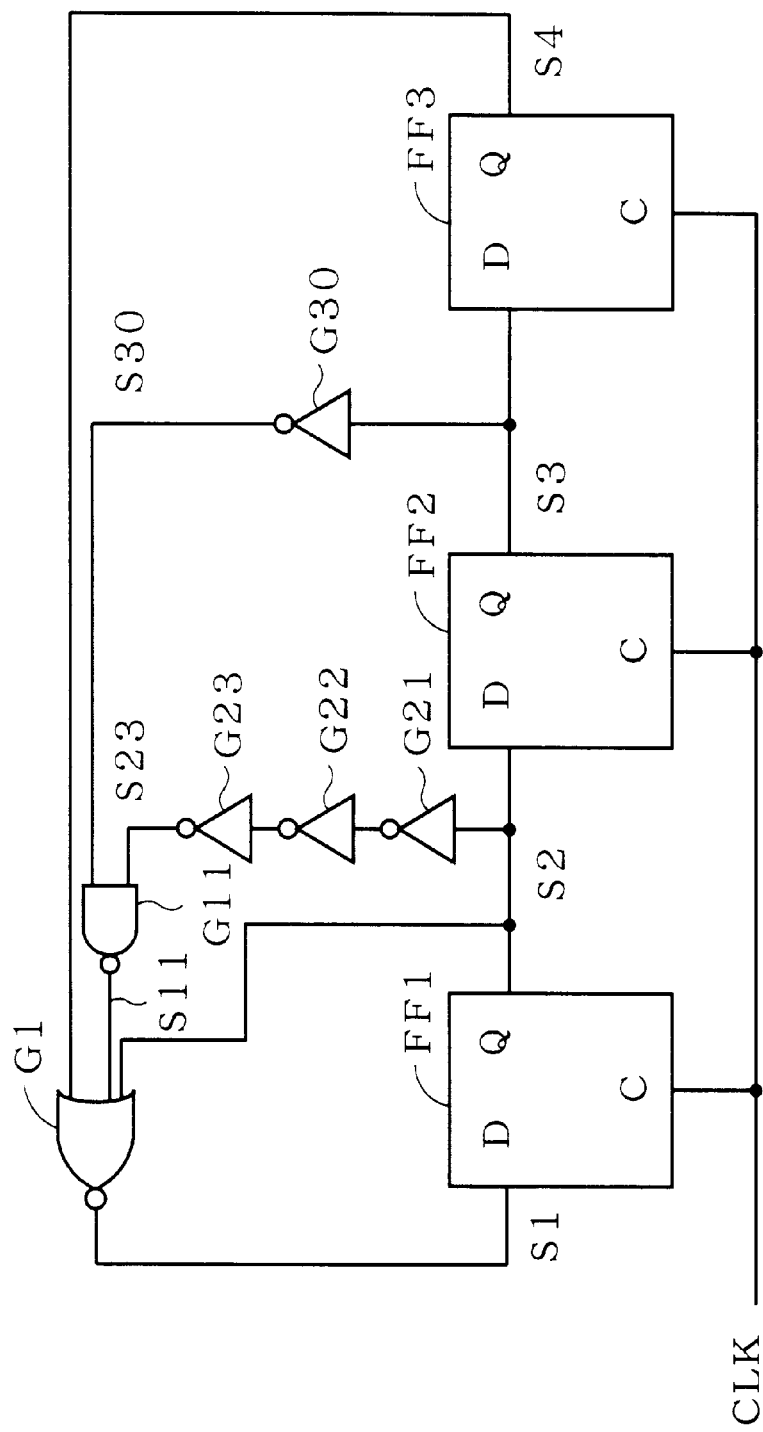
FIG. 9 is a circuit diagram showing a concrete counter circuit structure of the first aspect of the third preferred embodiment.

FIG. 9 is a circuit diagram showing a concrete example of the basic structure of the first aspect of the third preferred embodiment as shown in FIG. 8.

Referring to FIG. 9, there are provided three stages of inverters G21 to G23 connected in series as a delay element 13, one stage of inverter G30 as a delay element 14, and a NAND gate G11 as a delay element 15. The NAND gate G11 performs NAND operation on a signal S23 being the output of the inverter G23 and a signal S30 being the output of the inverter G30, to output a signal S11 to a NOR gate G1. The NOR gate G1 performs NOR operation on signals S11 and S4 to output a signal S1.

Suppose that each delay time of the inverters G21 to G23 and G30 is Δt1, and the delay time of the NAND gate G11 is Δt2, it follows that a delay time d13=3·Δt1, a delay time d14=Δt1, and a delay time d15=Δt2. Accordingly, a delay time d2=3·Δt1+Δt2, and a delay time d3=Δt1+Δt2.

(C) Operation

Figure 10:
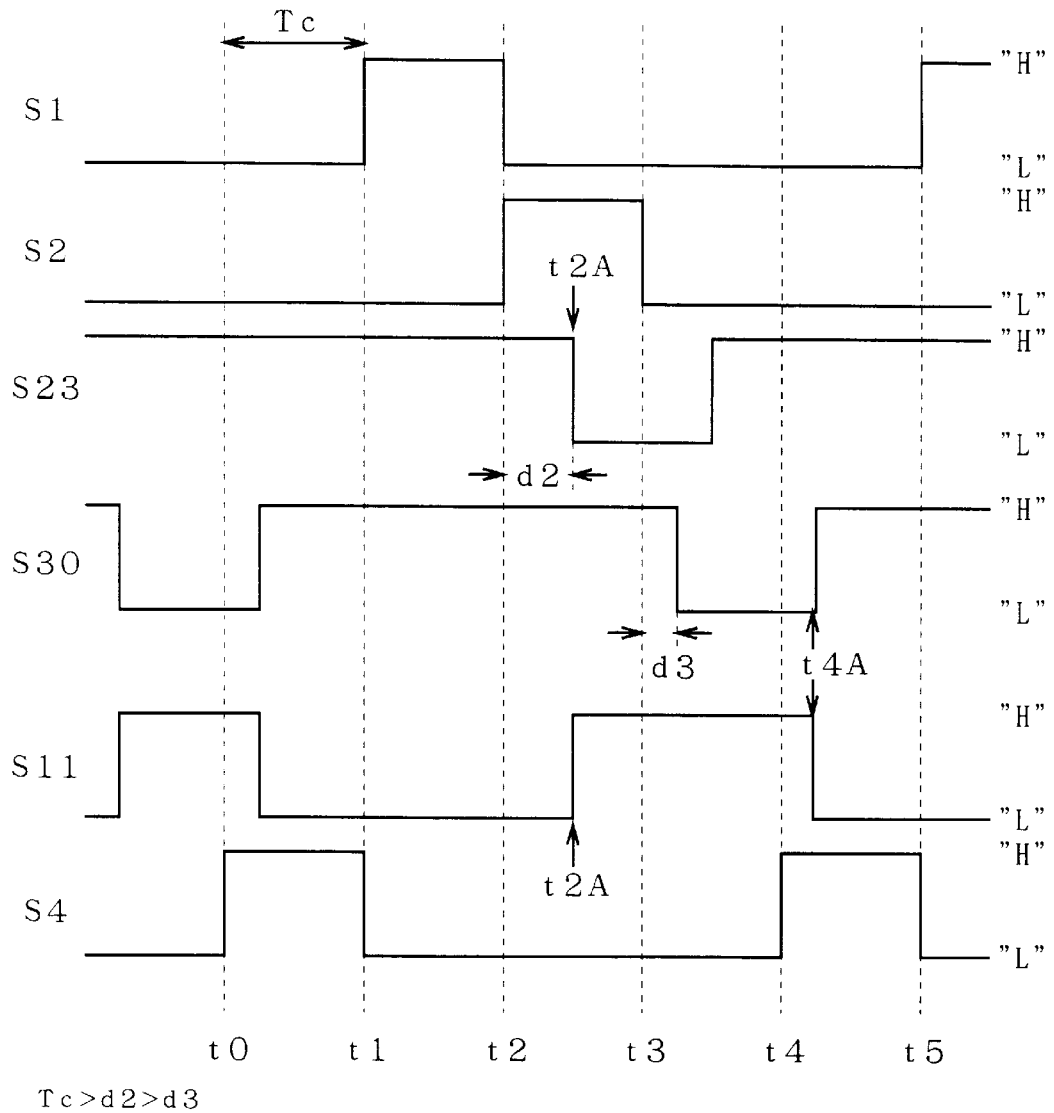
FIG. 10 is a timing chart showing a counter circuit operation of the first aspect of the third preferred embodiment.

FIG. 10 is a timing chart showing the counter circuit operation of the first aspect of the third preferred embodiment. In FIG. 10, time t0 to t5 denote the respective rise time of a clock CLK, and Tc denotes a clock cycle. That is, FIG. 10 shows the case of Tc>d2>d3 wherein d15="0", d2=d13, and d3=d14.

Signal S23 falls to "L" at time t2A after a delay time d2 has lapsed since time t2 at which a signal S2 rises to "H", thereafter, maintains "L" during a clock cycle Tc. On the other hand, a signal S30 falls to "L" after a delay time d3 has lapsed since time t3 at which a signal S3 (not shown) rises to "H", thereafter, maintains "L" during a clock cycle Tc and then rises to "H" at time t4A.

Accordingly, a signal S11 that is the result of NAND operation on signals S23 and S30, rises to "H" at time t2A and then falls to "L" at time t4A. Signal S4 becomes "H" at time t4 and maintains "H" until time t5.

Signal S1 that is the output of the NOR gate G1 becomes "H" when signals S2, S11 and S4 are all "L". Therefore, as shown in FIG. 10, the signal of "H" as an active value, cycles every clock cycle Tc in the order of signals S1, S2, S3, S4, S1 . . . , so that each of the signals S1 to S4 becomes "H" once every four times of the clock cycle Tc of a clock CLK.

As in the first preferred embodiment, in the first aspect of the third preferred embodiment there exists no period that signals S2, S11 and S4 are all "L" when the "H" of the signal S2 is transmitted to a signal S3, thus causing no spike shaped noise in a signal S1. The same is true for the case where the "H" of a signal S3 is transmitted to a signal S4.

As set forth above, the counter circuit of the first aspect of the third preferred embodiment provides the effects that the signal S1 is free from noise and hence there is no danger of malfunction.

Furthermore, as the first aspect of the second preferred embodiment, the first aspect of the third preferred embodiment has a sufficient timing margin when a signal S1 falls to "L". This leads to a stable operation and enables to respond to a high-speed clock CLK.

Referring again to FIG. 9, in the circuit structure of the first aspect of the third preferred embodiment, the number of transistors of CMOS structure required in the logical circuit portions other than the D-type flip-flops FF1 to FF3, is: 8 (2×4) are for the inverters 21 to 23 and 30; 4 are for the NAND gate G11 for two inputs; and 6 are for the NOR gate G1 for three inputs, thus summing up to 18. That is, it is possible to reduce the number of transistors by 2, over the circuit structure of the second preferred embodiment shown in FIG. 7. This permits a reduction in the number of elements, leading to a low electric power consumption.

[Second Aspect]

(A) Basic Structure

Figure 11:
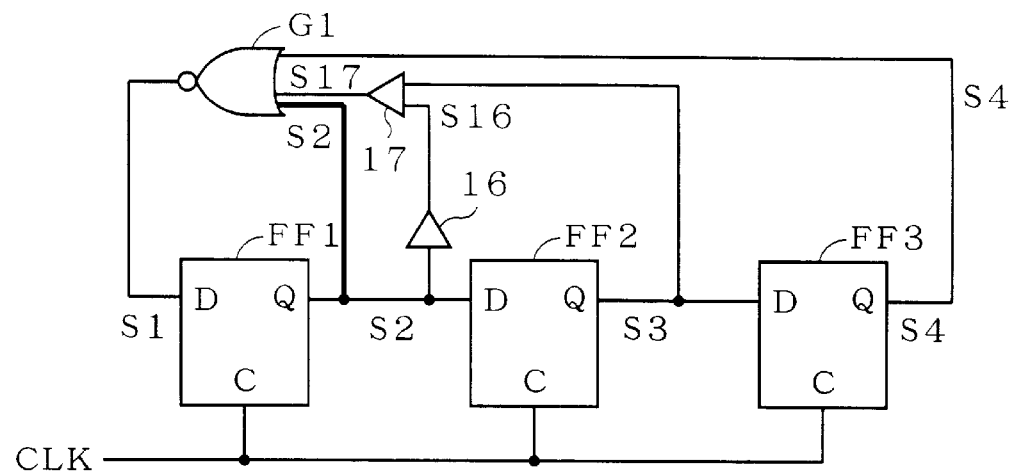
FIG. 11 is a circuit diagram showing a counter circuit structure of a second aspect of the third preferred embodiment.

FIG. 11 is a circuit diagram showing a basic structure of a third preferred embodiment. This structure is similar to that of FIG. 3 in the second preferred embodiment, except that the delay elements 11 and 12 are replaced by delay elements 16 and 17, and the NOR gate G2 for four inputs is replaced by a NOR gate G1 for three inputs.

The delay element 16 delays a signal S2 by a delay time d16 to output a signal S16, and the delay element 17 receives the signals S16 and S3, performs a predetermined logical operation on the signals S16 and a signal S3, and delays its logical result by a delay time d17 to output it as a signal S17. In this case, the delay element 17 outputs the signal S17 that becomes "L" when the signals S2 and S3 are both "L", or becomes "H" in other cases.

The NOR gate G1 for three inputs receives signals S2, S17 and S4 and performs NOR operation on the signals S2, S17 and S4, to output a signal S1.

With this structure, the counter circuit of the second aspect of the third preferred embodiment provides an operation equivalent to the counter circuit of FIG. 3 in the second preferred embodiment, when a delay time d2=d16+d17 and a delay time d3=d17<d2.

(B) Concrete Structure

Figure 12:
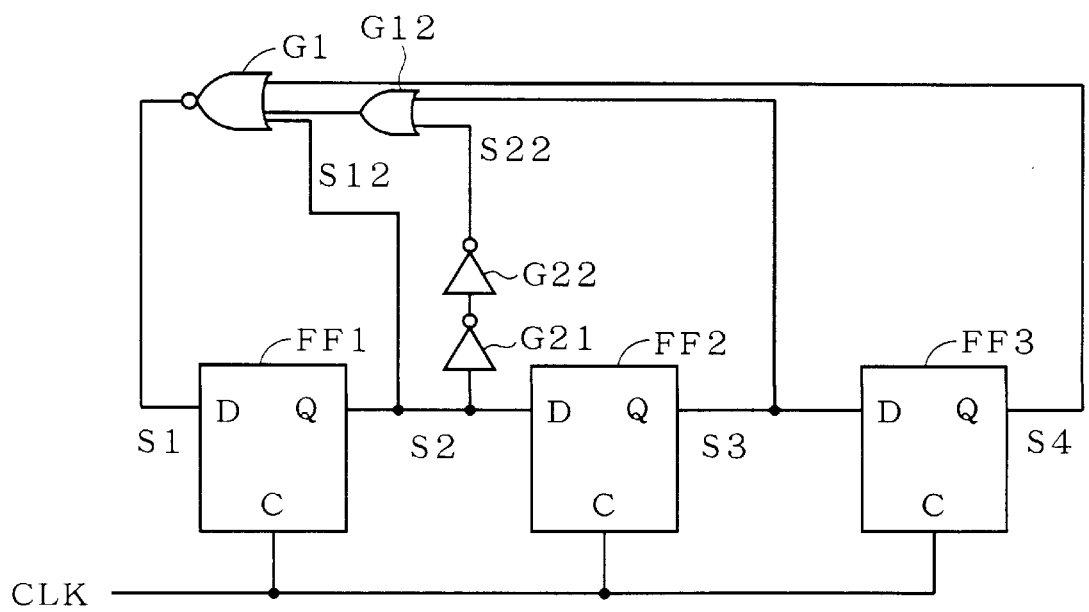
FIG. 12 is a circuit diagram showing a concrete counter circuit structure of the second aspect of the third preferred embodiment.

FIG. 12 is a circuit diagram showing a concrete example of the basic structure of the second aspect in the third preferred embodiment shown in FIG. 11.

Referring to FIG. 12, there are provided two stages of inverters G21 and G22 connected in series as a delay element 16, and an OR gate G12 as a delay element 17. The OR gate G12 performs OR operation on a signal S22 being the output of the inverter G22 and a signal S3, to output a signal S12 to a NOR gate G1. The NOR gate G1 performs NOR operation on the signal S12 and a signal S4 to output a signal S1.

Suppose that each delay time of the inverters G21, G22 and G30 is $\Delta t1$, and the delay time of the NAND gate G11 is $\Delta t2$, it follows that a delay time d16=2·$\Delta t1$, and a delay time d17=$\Delta t2$. Accordingly, a delay time d2=2·$\Delta t1$+$\Delta t2$, and a delay time d3=$\Delta t2$.

(C) Operation

Figure 13:
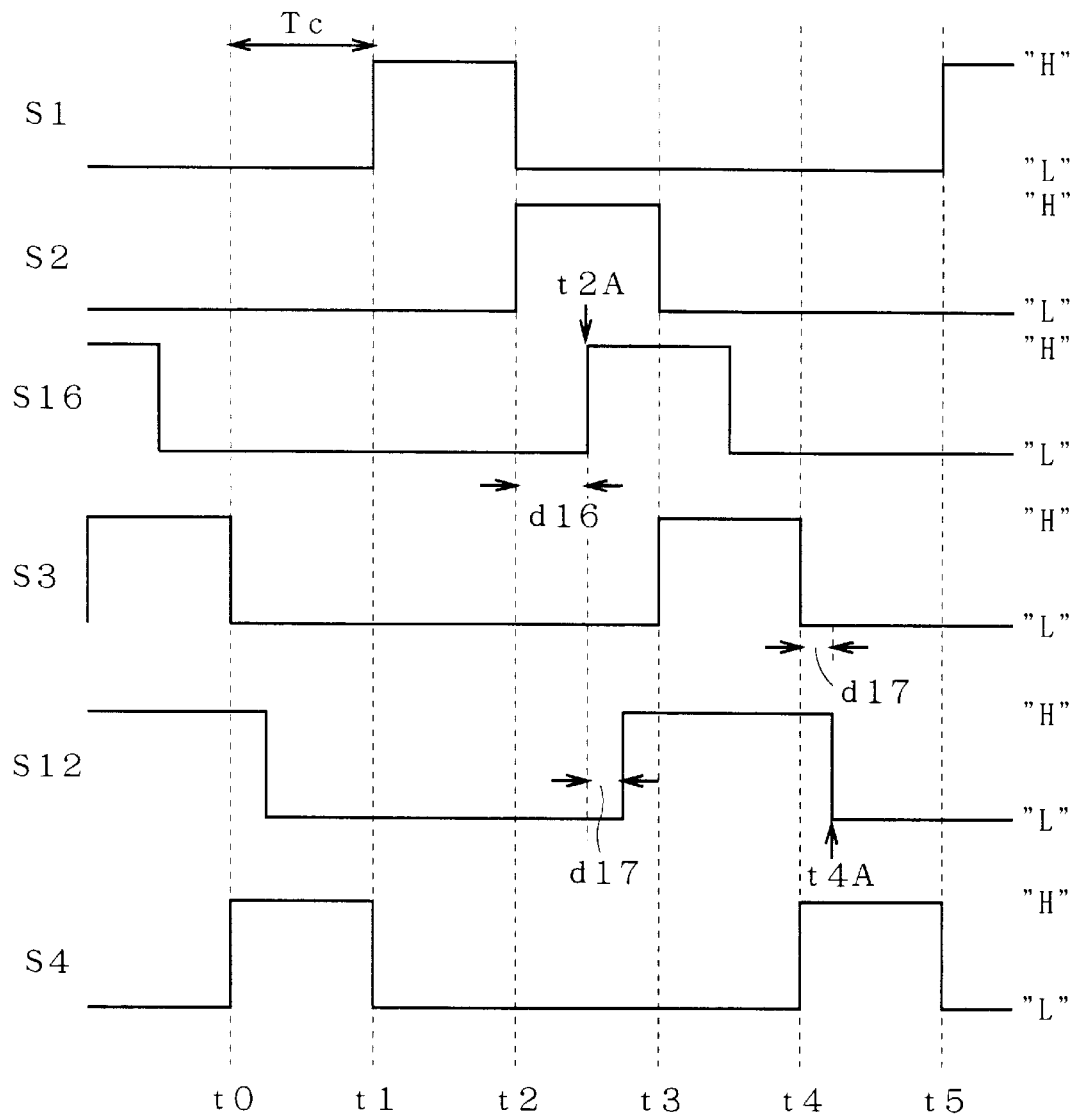
FIG. 13 is a timing chart showing a counter circuit operation of the second aspect of the third preferred embodiment.

FIG. 13 is a timing chart showing the counter circuit operation of the second aspect of the third preferred embodiment. In FIG. 13, time t0 to t5 denote the respective rise time of a clock CLK, and Tc denotes a clock cycle. That is, FIG. 13 shows the case of Tc>d2>d3 wherein d2=d16+d17 and d3=d17.

Signal S16 rises to "H" at time t2A after a delay time d16 has lapsed since time t2 at which a signal S2 rises to "H", thereafter, maintains "H" during a clock cycle Tc. Accordingly, a signal S12 that is the result of OR operation on signals S16 and S3 rises to "H" after a delay time d17 has lapsed since time t2A, and then falls to "L" at time t4A after a delay time d17 has lapsed since time t4 at which the signal S3 falls to "L". Signal S4 becomes "H" at time t4 and maintains "H" until time t5.

Signal S1 that is the output of the NOR gate G1 becomes "H" when signals S2, S12 and S4 are all "L". Therefore, as shown in FIG. 13, the signal of "H" as an active value, cycles every clock cycle Tc in the order of signals S1, S2, S3, S4, S1 . . . , so that each of the signals S1 to S4 becomes "H" once every four times of the clock cycle Tc of a clock CLK.

As in the first preferred embodiment, in the second aspect of the third preferred embodiment there exists no period that signals S2, S12 and S4 are all "L" when the "H" of the signal S2 is transmitted to a signal S3, thus causing no spike shaped noise in a signal S1. The same is true for the case where the "H" of a signal S3 is transmitted to a signal S4.

As set forth above, the counter circuit of the second aspect of the third preferred embodiment provides the effects that the signal S1 is free from noise and hence there is no danger of malfunction.

Furthermore, like the first aspect of the second preferred embodiment, the second aspect of the third preferred embodiment has a sufficient timing margin when a signal S1 falls to "L". This leads to a stable operation and enables to respond to a high-speed clock CLK.

Referring again to FIG. 12, in the circuit structure of the second aspect of the third preferred embodiment, the number of transistors of CMOS structure required in the logical circuit portions other than the D-type flip-flops FF1 to FF3 is: 4 (2×2) are for the inverters G21 and G22; 6 are for the OR gate G12 for two inputs; and 6 are for the NOR gate G1 for three inputs, thus summing up to 16. That is, it is possible to reduce the number of transistors by 2, over the circuit structure of the first aspect of the third preferred embodiment shown in FIG. 9. This permits a reduction in the number of elements.

Fourth Preferred Embodiment

Figure 14:
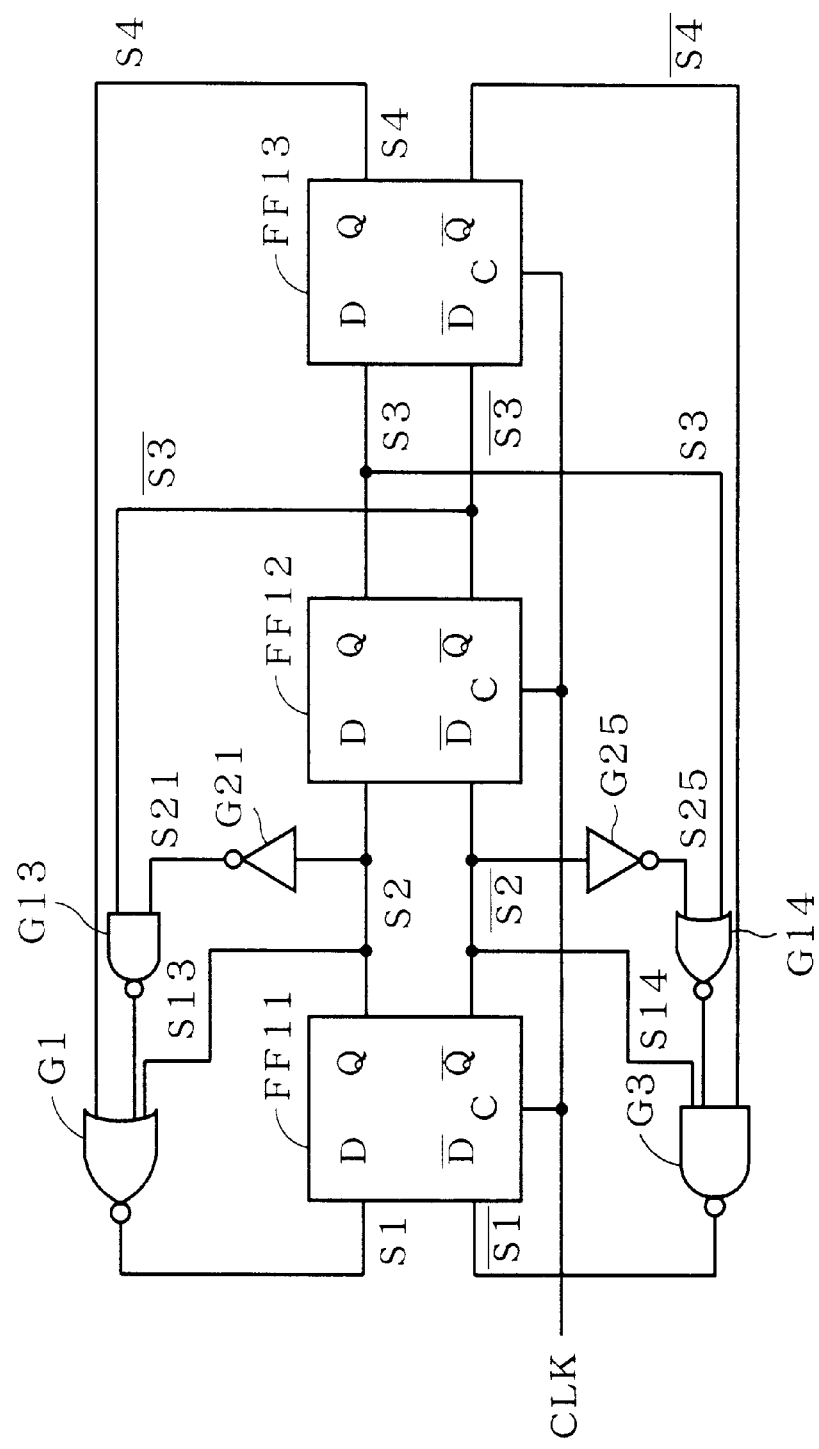
FIG. 14 is a circuit diagram showing a counter circuit structure according to a fourth preferred embodiment.

FIG. 14 is a circuit diagram showing a counter circuit structure according to a fourth preferred embodiment. In FIG. 14, three stages of D-type flip-flops FF11 to FF13 with a complementary I/O function which receive a clock CLK in common at their C (clock) inputs, are connected in series. Specifically, the D-type flip-flop FF11 receives a signal S1 at its (non-inverted) D input and outputs a (non-inverted) signal S2 from its (non-inverted) Q output, the D-type flip-flop FF12 receives the signal S2 at its D input and outputs a (non-inverted) signal S3 from its (non-inverted) Q output, and the D-type flip-flop FF13 receives the signal S3 at its (non-inverted) D input and outputs a (non-inverted) signal S4 from its (non-inverted) Q output.

The D-type flip-flop FF11 also receives an inverted signal $\overline{S1}$ at its inverted D input ($\overline{D}$) and outputs an inverted signal $\overline{S2}$ from its inverted Q output ($\overline{Q}$). The D-type flip-flop FF12 also receives the inverted signal $\overline{S2}$ at its inverted D input and outputs an inverted signal $\overline{S3}$ from its inverted Q output. The D-type flip-flop FF13 also receives the inverted signal $\overline{S3}$ at its inverted D input and outputs an inverted signal $\overline{S4}$ from its inverted Q output.

An inverter G21 performs the inversion operation (a delay time d21) on a signal S2 to output a signal S21. NAND gate G13 performs NAND operation (a delay time d22) on the signal S21 and an inverted signal $\overline{S3}$ to output a signal S13. NOR gate G1 performs NOR operation on signals S2, S13 and S4, to output a signal S1.

An inverter G25 performs the inversion operation (a delay time d23) on an inverted signal $\overline{S2}$ to output a signal S25. NOR gate G14 performs NOR operation (a delay time d24) on the signal S25 and a signal S3 to output a signal S14. NAND gate G3 performs NAND operation on the inverted signal $\overline{S2}$, the signal S14, an inverted signal $\overline{S4}$ and a signal S4, to output a signal $\overline{S1}$.

Thus, a circuit having a structure approximately equivalent to that of the second aspect of the third preferred embodiment is realized by that a circuit group for generating a signal S1 (i.e., G1, G13 and G21) employs the inverter G21 and the NAND gate G13 as a delay element. Also, a circuit having a structure approximately equivalent to that of the second aspect of the third preferred embodiment is realized by that a circuit group for generating an inverted signal $\overline{S1}$ (i.e., G3, G14 and G25) employs the inverter G25 and the NOR gate G14 as a delay element (the NAND gate is replaced by the NOR gate because of the negative logic).

[Operation]

Figure 15:
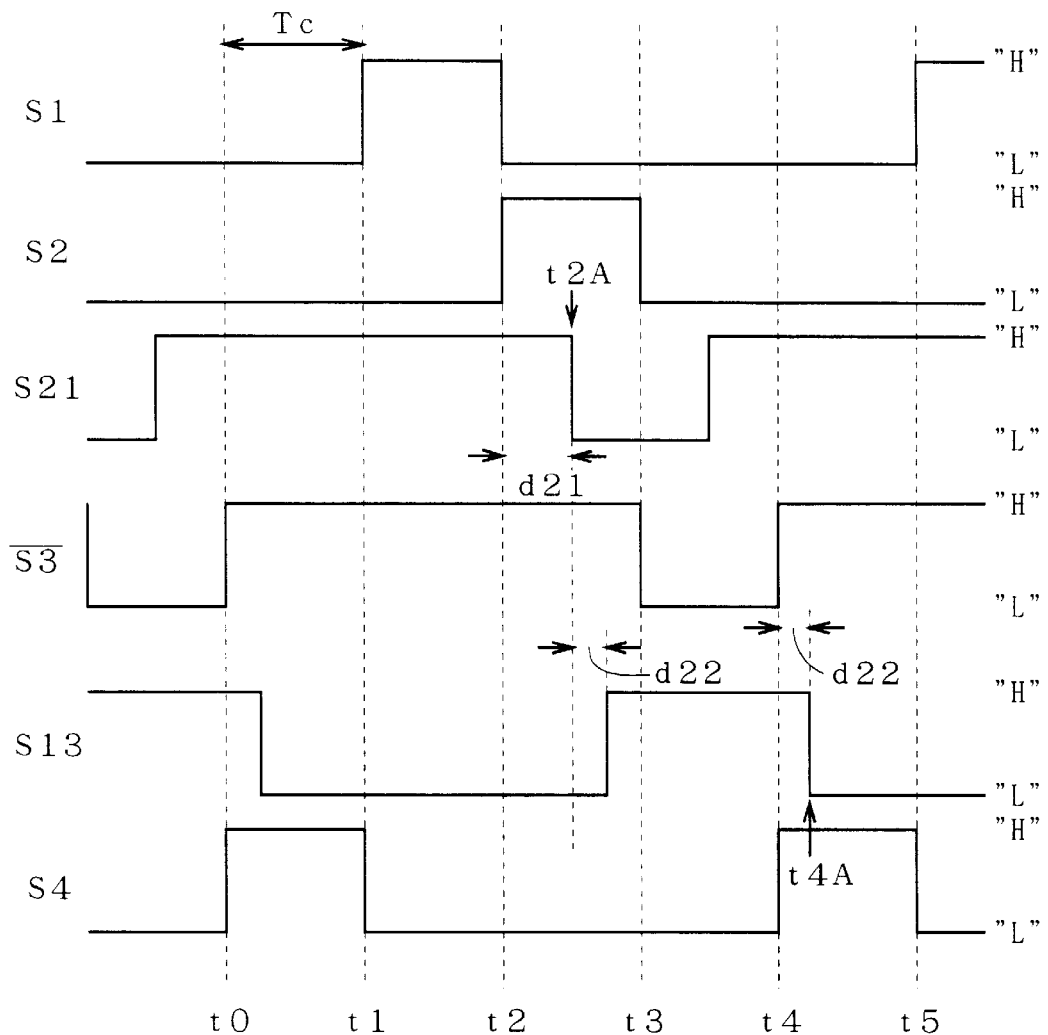
FIG. 15 is a timing chart showing one operation of the counter circuit of the fourth preferred embodiment.

FIG. 15 is a timing chart showing the output operation of signals S1 to S4 on the counter circuit of the fourth preferred embodiment. In FIG. 15, time t0 to t5 denote the respective rise time of a clock CLK, and Tc denotes a clock cycle. That is, FIG. 15 shows the case of Tc>d2>d3 wherein d2=d21+d22 and d3=d22.

Signal S21 falls to "L" at time t2A after a delay time d21 has lapsed since time t2 at which a signal S2 rises to "H", thereafter, maintains "L" during a clock cycle Tc. Accordingly, a signal S13 that is the result of NAND operation on a signal S21 and an inverted signal $\overline{S3}$, rises to "H" after a delay time d22 has lapsed since time t2A, and then falls to "L" at time t4A after a delay time d22 has lapsed since time t4 at which an inverted signal $\overline{S3}$ rises to "H". Signal S4 becomes "H" at time t4 and maintains "H" until time t5.

Signal S1 that is the output of the NOR gate G1 becomes "H" when signals S2, S13 and S4 are all "L". Therefore, as shown in FIG. 15, the signal of "H" as an active value, cycles every clock cycle Tc in the order of signals S1, S2, S3, S4, S1 ..., so that each of the signals S1 to S4 becomes "H" once every four times of the clock cycle Tc of a clock CLK.

As in the first preferred embodiment, in the counter circuit of the fourth preferred embodiment, there exists no period that signals S2, S13 and S4 are all "L" when the "H" of the signal S2 is transmitted to an inverted signal $\overline{S3}$, causing no spike shaped noise in a signal S1. The same is true for the case where the "H" of an inverted signal $\overline{S3}$ is transmitted to a signal S4.

As set forth above, the counter circuit of the fourth preferred embodiment provides the effects that the signal S1 is free from noise and hence there is no danger of malfunction.

Furthermore, like the first aspect of the second preferred embodiment, the counter circuit of the fourth preferred embodiment has a sufficient timing margin when a signal S1 falls to "L". This leads to a stable operation and enables to respond to a high-speed clock CLK.

Referring again to FIG. 14, in the circuit structure of the fourth preferred embodiment, the number of transistors of CMOS structure required in the logical circuit portions for generating a signal S1 is: 2 are for the inverter G21; 4 are for the NAND gate G13 for two inputs; and 6 are for the NOR gate G1 for three inputs, thus summing up to 12. That is, it is possible to reduce the number of transistors by as much as 4, over the circuit structure of the second aspect of the third preferred embodiment shown in FIG. 12. This permits a reduction in the number of elements.

Figure 16:
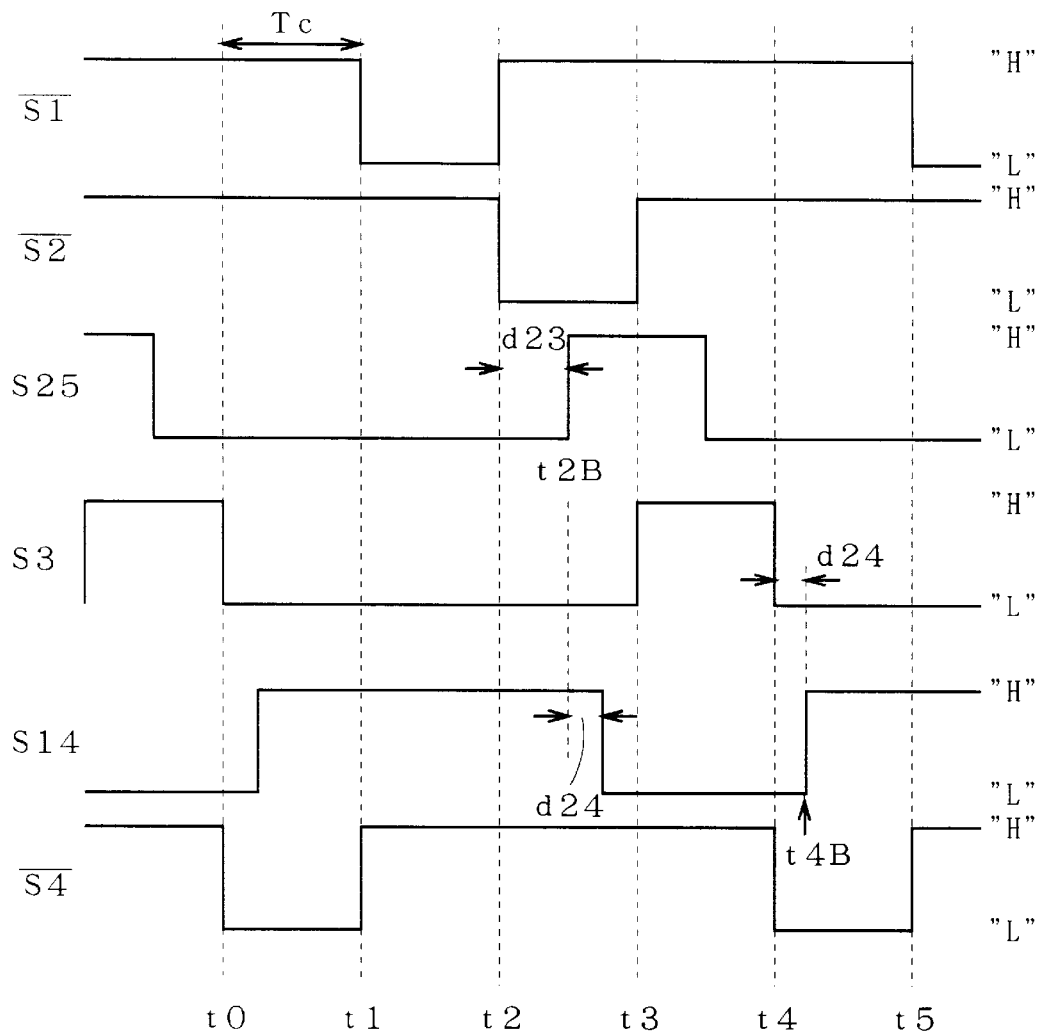
FIG. 16 is a timing chart showing another operation of the counter circuit of the fourth preferred embodiment.

FIG. 16 is a timing chart showing the output operations on inverted signals $\overline{S1}$ to $\overline{S4}$ on the counter circuit of the fourth preferred embodiment. In FIG. 16, time t0 to t5 denote the respective rise time of a clock CLK, and Tc denotes a clock cycle. That is, FIG. 16 shows the case of Tc>d2>d3 wherein d2=d23+d24 and d3=d24.

Signal S25 rises to "H" at time t2B after a delay time d23 has lapsed since time t2 at which a signal S2 falls to "L", thereafter, maintains "H" during a clock cycle Tc. Accordingly, a signal S14 that is the result of NOR operation on signals S25 and S3, falls to "L" after a delay time d24 has elapsed since time t2B, and then rises to "H" at time t4B after a delay time d24 has elapsed since time t4 at which a signal S3 falls to "L". An inverted signal $\overline{S4}$ becomes "L" at time t4 and maintains "L" until time t5.

An inverted signal $\overline{S1}$ that is the output of the NAND gate G3 becomes "H" when an inverted signal $\overline{S2}$, a signal S14 and an inverted signal $\overline{S4}$ are all "L". Therefore, as shown in FIG. 16, the signal of "L" as an active value, cycles every clock cycle Tc in the order of inverted signals $\overline{S1}, \overline{S2}, \overline{S3}, \overline{S4}$, $\overline{S1}$ ..., so that each of the inverted signals $\overline{S1}$ to $\overline{S4}$ becomes "L" once every four times of the clock cycle Tc of a clock CLK.

In the counter circuit of the fourth preferred embodiment, there exists no period that an inverted signal $\overline{S2}$, a signal S14 and an inverted signal $\overline{S4}$ are all "H" when the "L" of the inverted signal $\overline{S2}$ is transmitted to an inverted signal $\overline{S3}$, causing no spike shaped noise in an inverted signal $\overline{S1}$. The same is true for the case where the "L" of an inverted signal $\overline{S3}$ is transmitted to an inverted signal $\overline{S4}$.

As set forth above, the counter circuit of the fourth preferred embodiment provides the effects that an inverted signal $\overline{S1}$ is free from noise and thus there is no danger of malfunction, as in the signal S1.

Furthermore, like the first aspect of the second preferred embodiment, the counter circuit of the fourth preferred embodiment has a sufficient timing margin when an inverted signal $\overline{S1}$ rises to "H". This leads to a stable operation and enables to respond to a high-speed clock CLK.

Referring again to FIG. 14, in the circuit structure of the fourth preferred embodiment, the number of transistors of CMOS structure required in the logical circuit portions for generating an inverted signal $\overline{S1}$ is: 2 are for the inverter G25; 4 are for the NOR gate G14 for two inputs; and 6 are for the NAND gate G3 for three inputs, thus summing up to 12. That is, it is possible to reduce the number of transistors by as much as 4, over the circuit structure of the second aspect of the third preferred embodiment shown in FIG. 12. This permits a reduction in the number of elements.

As set forth above, in the fourth preferred embodiment it is possible to select one of a signal S (i+1) obtained from the Q output of D-type flip-flop FF1$i$ (i=1,2 or 3) and a signal $\overline{S(i+1)}$ being an inverted Q output, which is capable of reducing the number of elements. This permits a further reduction in the number of transistors of CMOS structure required in the logical circuit portions for generating a signal S1 or an inverted signal $\overline{S1}$, as compared with the second aspect of the third preferred embodiment.

Fifth Preferred Embodiment

Figure 17:
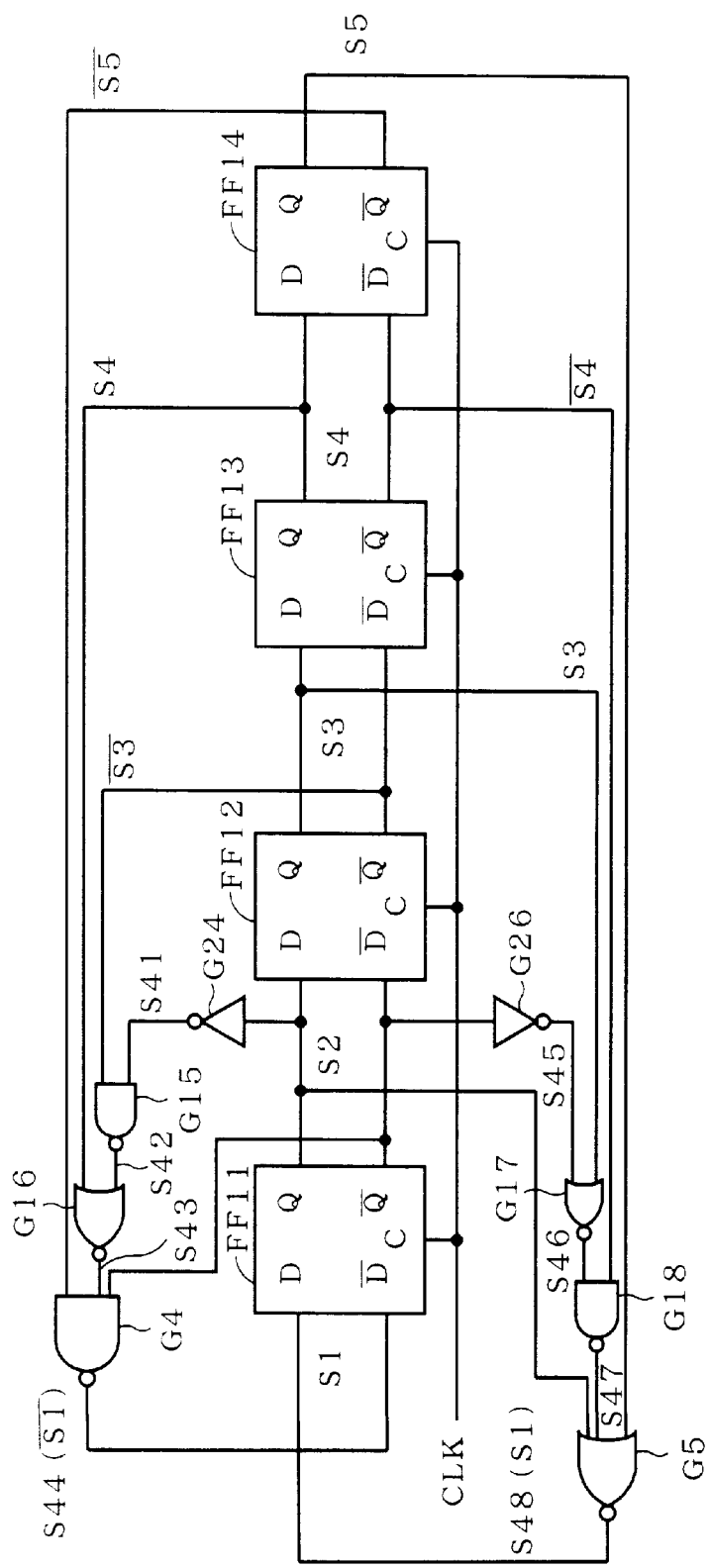
FIG. 17 is a circuit diagram showing a counter circuit structure according to a fifth preferred embodiment.

FIG. 17 is a circuit diagram showing a counter circuit structure according to a fifth preferred embodiment. There are provided four stages of D-type flip-flops FF11 to FF14 with a complementary I/O function which receives a clock CLK in common at their C (clock) inputs. These flip-flops FF11 to FF14 are connected in series between their D inputs and Q outputs and between their inverted D inputs and inverted Q outputs, respectively.

An inverter G24 performs the inversion operation (a delay time d31) on a signal S2 to output a signal S41. NAND gate G15 performs NAND operation (a delay time d32) on the signal S41 and an inverted signal $\overline{S3}$ to output a signal S42. NOR gate G16 performs NOR operation (a delay time d33) on the signal S42 and a signal S4 to output a signal S43. NAND gate G4 performs NAND operation on an inverted signal $\overline{S2}$, the signal S43 and an inverted signal $\overline{S5}$, to output a signal S44 (an inverted signal $\overline{S1}$). The signal S44 is taken in the inverted D input of the D-type flip-flop FF11.

An inverter G26 performs the inversion operation (a delay time d34) on an inverted signal $\overline{S2}$ to output a signal S45. NOR gate G17 performs NOR operation (a delay time d35) on the signal S45 and a signal S3 to output a signal S46. NAND gate G18 performs NAND operation on the signal S46 and an inverted signal $\overline{S4}$ to output a signal S47. NOR gate G5 performs NOR operation on a signal S2, the signal S47 and a signal S5, to output a signal S48 (a signal S1). The signal S48 is taken in the D input of the D-type flip-flop FF11.

Thus, a counter circuit having a 5-bit count function is realized by expanding the 4-bit count function of the fourth preferred embodiment. Specifically, a circuit group for generating an inverted signal $\overline{S1}$ (i.e., G4, G15, G16 and G24) employs the inverter G25, the NAND gate G15 and the NOR gate G16, as a delay element, and a circuit group for generating a signal S1 (i.e., G5, G17, G18 and G26) employs the inverter G26, the NOR gate G17 and the NAND gate 18, as a delay element.

[Operation]

Figure 18:
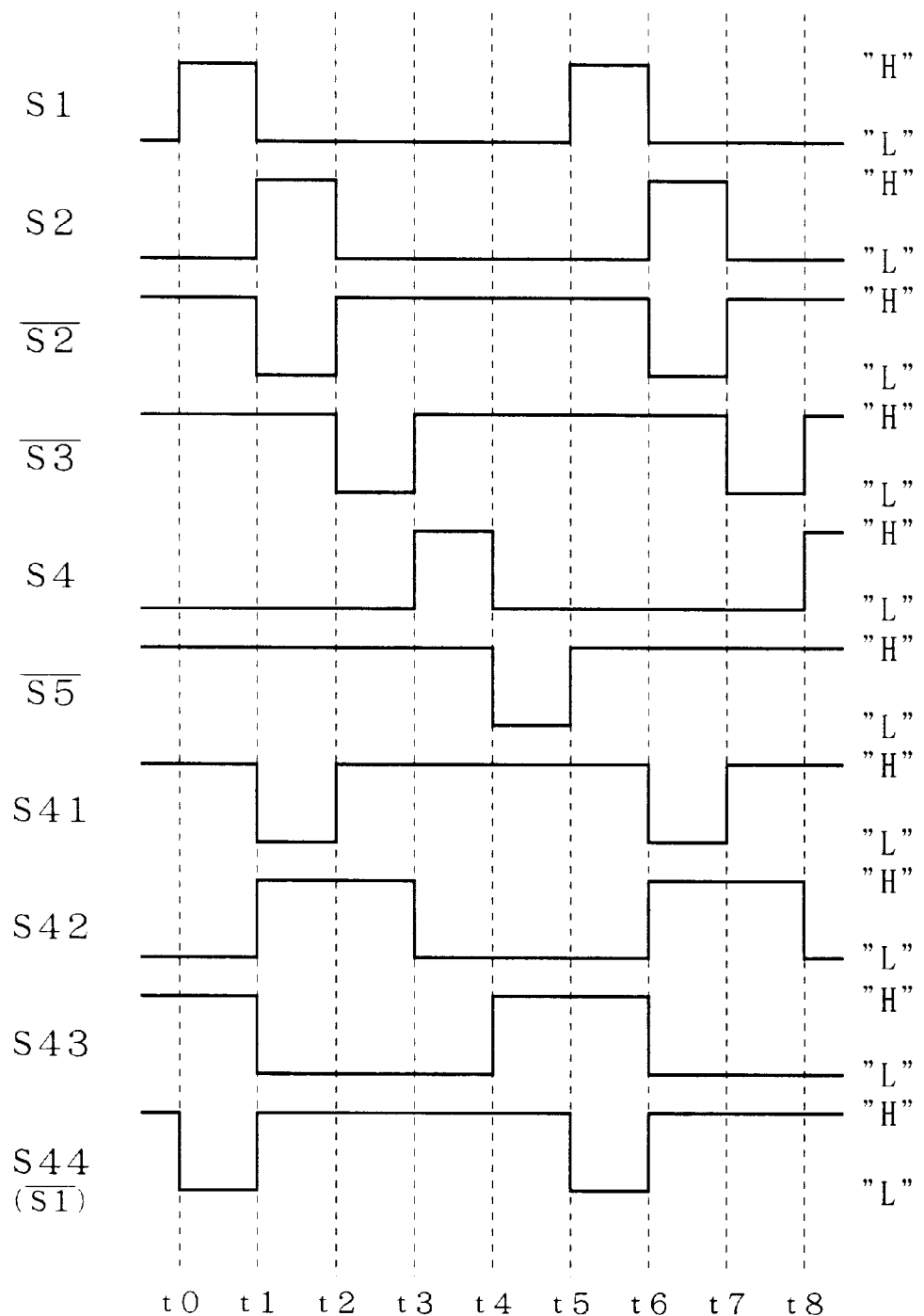
FIG. 18 is a timing chart showing a counter circuit operation of the fifth preferred embodiment.

FIG. 18 is a timing chart showing the output operations on inverted signals $\overline{S1}$ to $\overline{S5}$ on the counter circuit of the fifth preferred embodiment. In FIG. 18, time t0 to t8 denote the respective rise time of a clock CLK, and Tc denotes a clock cycle. The counter circuit of the fifth preferred embodiment is a 5-bit counter circuit which is obtained by expanding the 4-bit counter circuit of the fourth preferred embodiment. Therefore, it is evident to have a function equivalent to the 4-bit counter circuit of the fourth preferred embodiment, if the logical consistency is proved. Hence, FIG. 18 shows no influences of the delay time d31, d32 and d33.

Referring to FIG. 18, a signal S41 falls to "L" at time t1 at which a signal S2 rises to "H", thereafter, maintains "L" during a clock cycle Tc. Accordingly, a signal S42 that is the result of NAND operation on the signal S41 and an inverted signal $\overline{S3}$, rises to "H" at time t1 and then falls to "L" at time t3 at which the inverted signal $\overline{S3}$ rises to "H".

Signal S43 that is the result of NOR operation on a signal S42 and a signal S4, rises to "H" at time t4 at which the signal S4 falls to "L", and then falls to "L" at time t6 at which the signal S42 rises to "H". An inverted signal $\overline{S5}$ becomes "L" at time t4 and maintains "L" until time t5.

An inverted signal $\overline{S1}$ that is the output of NAND gate G4 becomes "L" when an inverted signal $\overline{S2}$, a signal S43 and an inverted signal $\overline{S5}$ are all "H". Therefore, as shown in FIG. 18, the signal of "L" as an active value, cycles every clock cycle Tc in the order of inverted signals $\overline{S1}, \overline{S2}, \overline{S3}, \overline{S4}, \overline{S5}, \overline{S1}$..., so that each of the inverted signals $\overline{S1}$ to $\overline{S5}$ becomes "L" once every five times of the clock cycle Tc of a clock CLK.

Although it is not shown in FIG. 18, as in the circuit group for generating an inverted signal $\overline{S1}$ (i.e., G4, G15, G16 and G24), the signal of "H" as an active value, cycles by a circuit group for generating a signal S1 (i.e., G5, G17, G18 and G26) every clock cycle Tc in the order of signals S1, S2, S3, S4, S5, S1..., so that each of the signals S1 to S5 becomes "H" once every five times of the clock cycle Tc of a clock CLK.

As set forth above, the counter circuit of the fifth preferred embodiment provides the same effects that the signal S1 and the inverted signal $\overline{S1}$ are free from noise and hence there is no danger of malfunction, as in the fourth preferred embodiment.

Referring again to FIG. 17, in the circuit structure of the fifth preferred embodiment, the number of transistors of CMOS structure required in the logical circuit portions for generating a signal S1 is: 2 are for the inverter G26, 4 are for the NOR gate G17 for two inputs; 4 are for the NAND gate G18 for two inputs; and 6 are for the NOR gate G5 for three inputs, thus summing up to 16.

On the other hand, the number of transistors of CMOS structure required in the logical circuit portions for generating an inverted signal $\overline{S1}$ is: 2 are for the inverter G24; 4 are for the NAND gate G15 for two inputs; 4 are for the NOR gate G16 for two inputs; and 6 are for the NAND gate G4 for three inputs, thus summing up to 16.

As set forth above, the counter circuit of the fifth preferred embodiment performs a 5-bit count function with a complementary I/O function, with a minimum required number of transistors.

Sixth Preferred Embodiment

Figure 19:
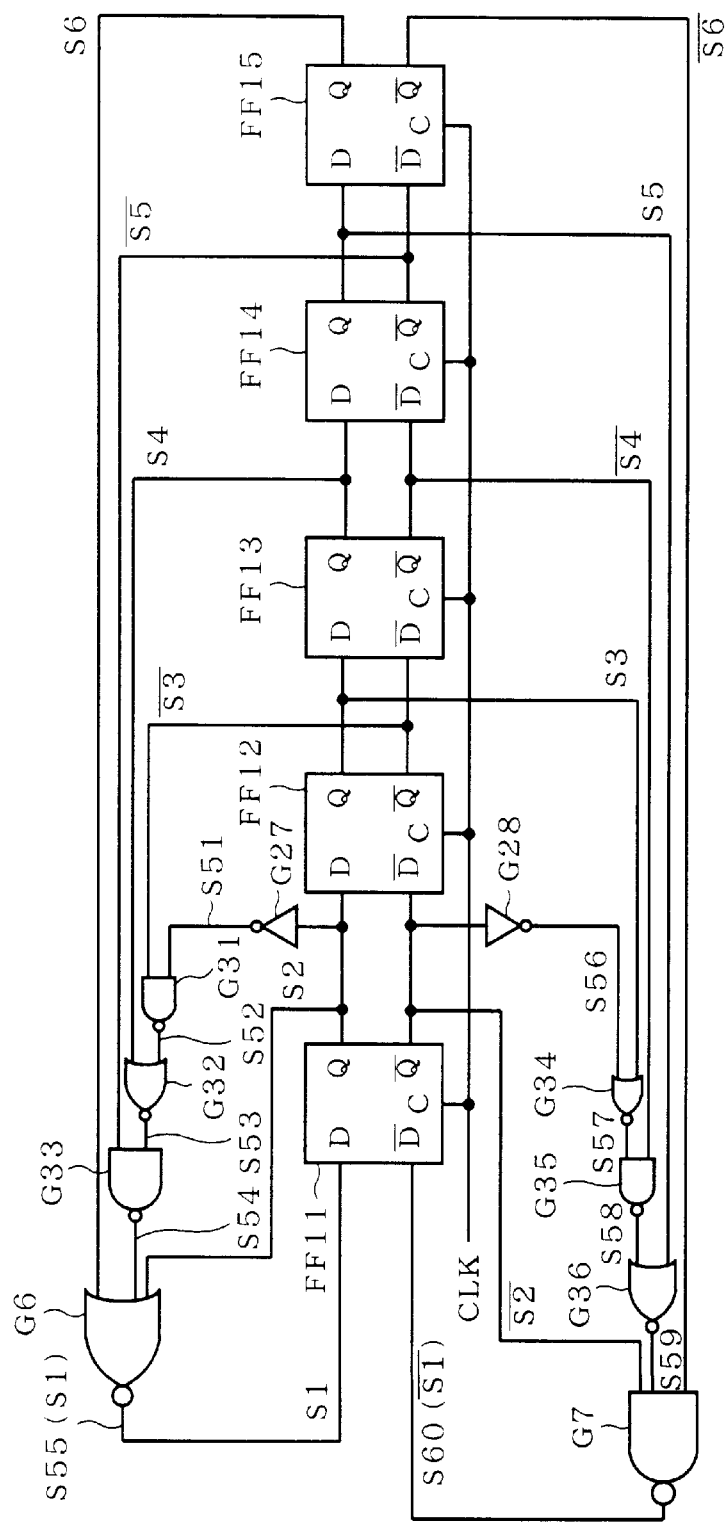
FIG. 19 is a circuit diagram showing a counter circuit structure according to a sixth preferred embodiment.

FIG. 19 is a circuit diagram showing a counter circuit structure according to a sixth preferred embodiment. There are provided five stages of D-type flip-flops FF11 to FF15 with a complementary I/O function which receive a clock CLK in common at their C (clock) inputs. These flip-flops FF11 to FF15 are connected in series between their D inputs and Q outputs and between their inverted D inputs and inverted Q outputs, respectively.

An inverter G27 performs the inversion operation (a delay time d41) on a signal S2 to output a signal S51. NAND gate G31 performs NAND operation (a delay time d42) on the signal S51 and an inverted signal $\overline{S3}$ to output a signal S52. NOR gate G32 performs NOR operation on the signal S52 and a signal S4 to output a signal S53. NAND gate G33 performs NAND operation (a delay time d44) on the signal S53 and an inverted signal $\overline{S5}$ to output a signal S54. NOR gate G6 performs NOR operation on the signals S2, S54 and a signal S6, to output a signal S55 (a signal S1). The signal S55 is taken in the D input of the D-type flip-flop FF11.

An inverter G28 performs the inversion operation (a delay time d45) on an inverted signal $\overline{S2}$ to output a signal S56. NOR gate G34 performs NOR operation (a delay time d46) on the signal S56 and a signal S53 to output a signal S57. NAND gate G35 performs NAND operation (a delay time d47) on the signal S57 and an inverted signal $\overline{S4}$ to output a signal S58. NOR gate G36 performs NOR operation (a delay time d48) on the signal S58 and a signal S5 to output a signal S59. NAND gate G7 performs NAND operation on the inverted signal $\overline{S2}$, the signal S59 and an inverted signal $\overline{S6}$, to output a signal S60 (an inverted signal $\overline{S1}$). The signal S60 is taken in the inverted D input of the D-type flip-flop FF11.

As stated above, a counter circuit with a 6-bit count function is realized by expanding the 4-bit count function of the third preferred embodiment by 2 bits. Specifically, a circuit group for generating a signal S1 (i.e., G6, G31 to G33, and G27) employs the inverter G27, NAND gate G31, NOR gate G32 and NAND gate 33, as a delay element, and a circuit group for generating an inverted signal $\overline{S1}$ (i.e., G7, G34 to G36, and G28) employs the inverter G28, NOR gate G34, NAND gate G35 and NOR gate G36, as a delay element.

[Operation]

Figure 20:
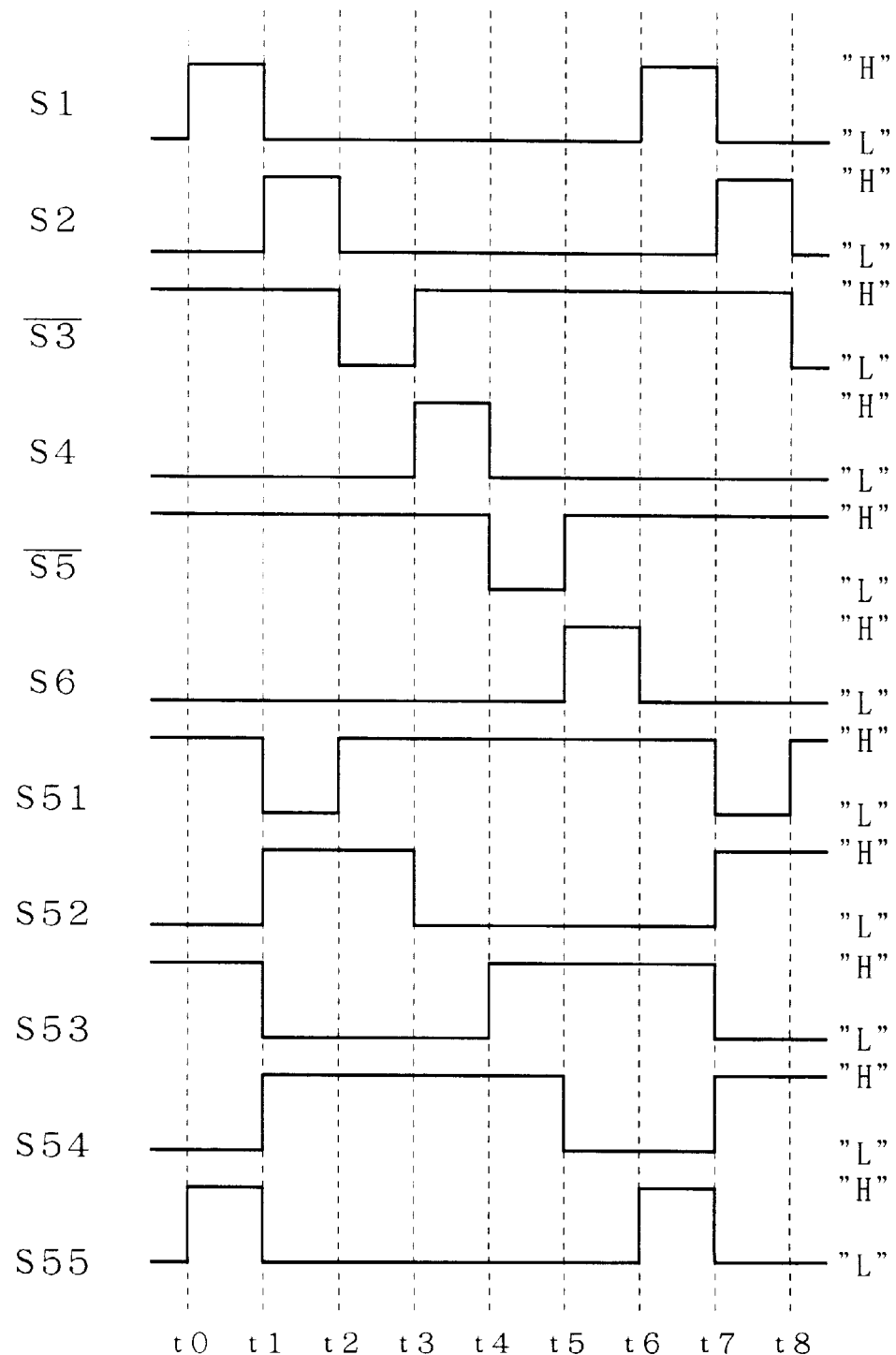
FIG. 20 is a timing chart showing a counter circuit operation of the sixth preferred embodiment.
Figure 21:
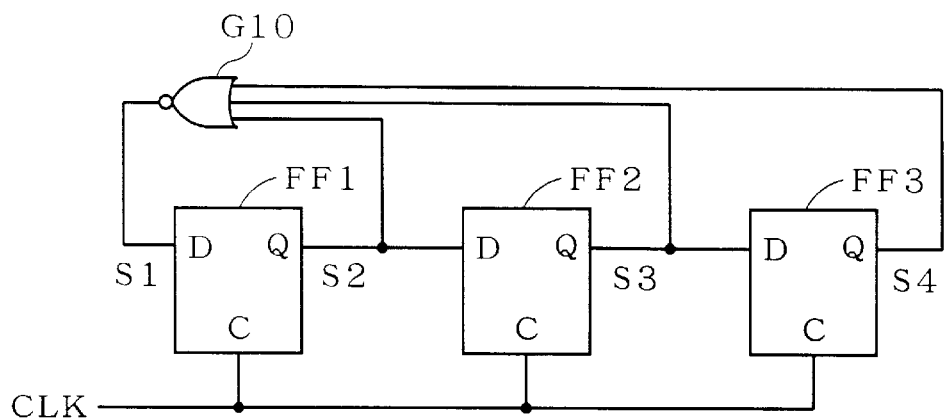
FIG. 21 is a circuit diagram showing a conventional counter circuit structure.
Figure 22:
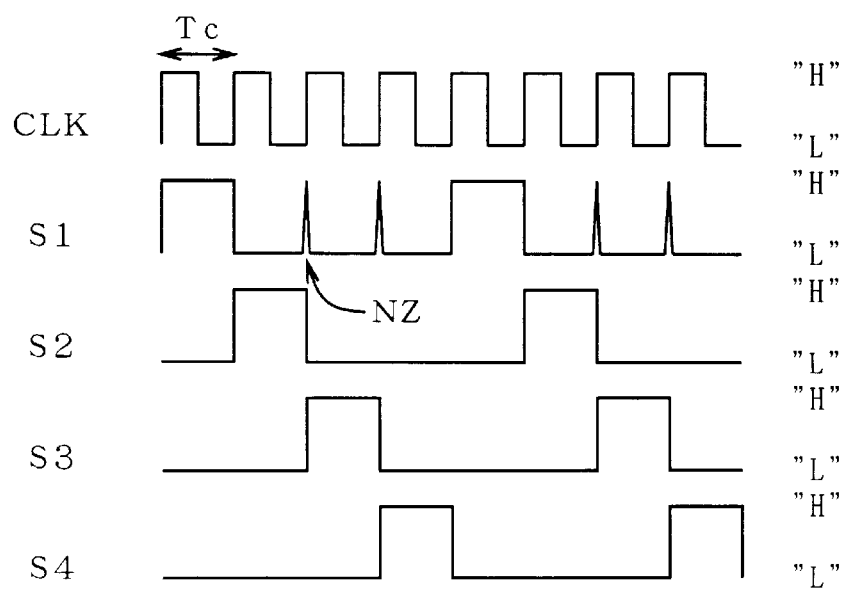
FIG. 22 is a timing chart showing an operation of a counter circuit of FIG. 21.

FIG. 20 is a timing chart showing the output operations on signals S1 to S6 on the counter circuit of the sixth preferred embodiment. In FIG. 20, time t0 to t8 denote the respective rise time of a clock CLK, and Tc denotes a clock cycle. The counter circuit of the sixth preferred embodiment is a 6-bit counter circuit which is obtained by expanding the 4-bit counter circuit of the fourth preferred embodiment. Therefore, like FIG. 18 of the fifth preferred embodiment, FIG. 20 shows no influences of the delay time d41 to d44.

Signal S51 falls to "L" at time t1 at which a signal S2 rises to "H", thereafter, maintains "L" during a clock cycle Tc. Accordingly, a signal S52 that is the result of NAND operation on the signal S51 and an inverted signal $\overline{S3}$, rises to "H" at time t1 and then falls to "L" at time t3 at which an inverted signal $\overline{S3}$ rises to "H".

Signal S53 that is the result of NOR operation on the signal S52 and a signal S4, rises to "H" at time t4 at which the signal S4 falls to "L", and then falls to "L" at time t6 at which the signal S52 rises to "H". Signal S54 that is the result of NAND operation on the signal S53 and an inverted signal $\overline{S5}$, rises to "H" at time t1 at which the signal S53 falls to "L", and then falls to "L" at time t5 at which the inverted signal $\overline{S5}$ rises to "H". Signal S6 becomes "H" at time t5 and maintains "H" until time t6.

Signal S55 (S1) that is the output of NOR gate G6 becomes "H" when signals S2, S54 and S6 are all "L". Therefore, as shown in FIG. 20, the signal of "H" as an active value, cycles every clock cycle Tc in the order of signals S1, S2, S3, S4, S5, S6, S1 . . . , so that each of the signals S1 to S6 becomes "H" once every six times of the clock cycle Tc of a clock CLK.

Although it is not shown in FIG. 20, as in the circuit group for generating a signal S1 (i.e., G6, G31 to G33, and G27), the signal of "L" as an active value, cycles by a circuit group for generating an inverted signal $\overline{S1}$ (i.e., G57, G34 to G36 and G28) every clock cycle Tc in the order of inverted signals $\overline{S1}$, $\overline{S2}$, $\overline{S3}$, $\overline{S4}$, $\overline{S5}$, $\overline{S6}$, $\overline{S1}$ . . . , so that each of the inverted signals $\overline{S1}$ to $\overline{S6}$ becomes "L" once every six times of the clock cycle Tc of a clock CLK.

As set forth above, the counter circuit of the sixth preferred embodiment provides the same effects that the signal S1 and the inverted signal $\overline{S1}$ are free from noise and thus there is no danger of malfunction, as in the fourth preferred embodiment.

Referring again to FIG. 19, in the circuit structure of the sixth preferred embodiment, the number of transistors of CMOS structure required in the logical circuit portions for generating a signal S1 is: 2 are for the inverter G27; 4 are for the NAND gate G31 for two inputs; 4 are for the NOR gate G32 for two inputs; 4 are for the NAND gate G33 for two inputs; and 6 are for the NOR gate G5 for three inputs, thus summing up to 20.

On the other hand, the number of transistors of CMOS structure required in the logical circuit portions for generating an inverted signal $\overline{S1}$ is: 2 are for the inverter G28; 4 are for the NOR gate G34 for two inputs; 4 are for the NAND gate G35 for two inputs; 4 are for the NOR gate G36 for two inputs; and 6 are for the NAND gate G7 for three inputs, thus summing up to 20.

As set forth above, the counter circuit of the sixth preferred embodiment performs a 6-bit count function with a complementary I/O function, with a minimum required number of transistors.

Others

Although there are described 4-bit counter circuits in the first to fourth preferred embodiments, a 5-bit counter circuit in the fifth preferred embodiment, and a 6-bit counter circuit in the sixth preferred embodiment, it is to be understood that the present invention is not limited to 4- to 6-bit ones, but is applicable to any of counter circuits of (N+1) bits in which N (N≧2) flip-flops are connected in series.

That is, it is recommended to provide a circuit equivalent to a logical operation means with a delay function which receives the first to Nth output signals that are the output signals of the first to Nth flip-flops, respectively, and performs the logical operations based on judgements as to whether all of the first to Nth output signals propagated through a predetermined signal path group so as to have descending signal propagation delay time in the order of first to Nth output signals, staring with the first and following through the Nth, are a first fixed value ("H" or "L"), thereby outputting its logical result output signal to the input section of a first flip-flop.

The logical operation means with a delay function corresponds to the delay elements 11, 12 and NOR gate G1 in the first preferred embodiment (see FIG. 1); the delay elements 11, 12 and NOR gate G2 in the second preferred embodiment (see FIG. 3); the delay elements 13 to 15 and NOR gate G1 in the first aspect of the third preferred embodiment (see FIG. 8); the delay elements 16, 17 and NOR gate G1 in the second aspect of the third preferred embodiment (see FIG. 11); the inverter G21 (G25), NAND gate G13 (NOR gate G14) and NOR gate G1 (NAND gate G3) in the fourth preferred embodiment (see FIG. 14); the inverter G26 (G24), NOR gate G17 (NAND gate G15), NAND gate G18 (NOR gate G16) and NOR gate G5 (NAND gate G4) in the fifth preferred embodiment (see FIG. 17); and the inverter G27 (G28), NAND gate G31 (NOR gate G34), NOR gate G32 (NAND gate G35), NAND gate G33 (NOR gate G36) and NOR gate G6 (NAND gate G7) in the sixth preferred embodiment (see FIG. 19).

While the invention has been shown and described in detail, the foregoing description is in all aspects illustrative and not restrictive. It is therefore understood that numerous modifications and variations can be devised without departing from the scope of the invention.

We claim:

1. A counter circuit comprising:
   first to Nth (N≧2) flip-flops connected in series between I/O from said first to Nth flip-flops, each operating in synchronization with a predetermined clock given in common; and a logical operation means with a delay function which receives first to Nth output signals as the respective output signals of said first to Nth flip-flops, performs logical operations based on judgements as to whether said first to Nth output signals are all a first fixed value to output a logical result output signal to an input section of said first flip-flop, said first to Nth output signals being propagated through a predetermined signal path group so as to have descending signal propagation delay time in the order of first to Nth output signals.

2. The counter circuit of claim 1, wherein said logical operation means with a delay function comprises:

first to Nth delay means that delay said first to Nth output signals by first to Nth delay time, respectively, to output first to Nth delay output signals, said first to Nth delay time being set in the order descending, starting with first and following through Nth, said Nth delay time including "0"; and a logical result output means that receives said first to Nth delay output signals and performs logical operations based on judgements as to whether said first to Nth delay output signals are all said first fixed value, to output said logical result output signal to said input section of said first flip-flop.

3. The counter circuit of claim 2 wherein said first to (N−1)th delay means are constructed by series connection of inverters, respectively, the stage number of said inverters being in the order of ascending from said (N−1)th delay means to said first delay means.

4. The counter circuit of claim 2 wherein said first delay time is shorter than said predetermined clock cycle.

5. The counter circuit of claim 2 wherein said logical result output means includes a means that further receives said first output signal and performs logical operations based on judgements as to whether said first to Nth delay output signals and said first output signal are all said first fixed value, to output said logical result output signal.

6. The counter circuit of claim 5 wherein said first delay time is shorter than said predetermined clock cycle.

7. The counter circuit of claim 5 wherein said first delay time is longer than said predetermined clock cycle and said second delay time is shorter than said predetermined clock cycle.

8. The counter circuit of claim 5 wherein said first delay time is shorter than the twice said predetermined clock cycle.

9. The counter circuit of claim 1, wherein said logical operation means with a delay function comprises:

a first delay means that delays said first output signal by a first delay time to output a first delay output signal;

second to (N−1)th delay means that perform logical operations based on second to (N−1)th fixed values and delay said second to (N−1)th output signals by second to (N−1)th delay time, respectively, to output second to (N−1)th delay output signals, ith (i=any one of 2 to (N−1)) delay means performing logical operations based on judgements as to whether (i−1)th delay output signal and ith output signal are both ith fixed value; and a logical result output means that receives said (N−1)th delay output signal and Nth output signal and performs logical operations based on judgments as to whether both are a first fixed value, to output said logical result output signal to said input section of said first flip-flop.

10. The counter circuit of claim 9 wherein the sum of said first to (N−1)th delay time is shorter than said predetermined clock cycle.

11. The counter circuit of claim 9 wherein said logical result output means includes a means that further receives said first output signal and performs logical operations based on judgements as to whether said (N−1)th delay output signal, said Nth delay output signal and said first output signal are all said first fixed value, to output said logical result output signal.

12. The counter circuit of claim 11 wherein,

N is equal to 3;

said first delay means includes two stages of inverters connected in series, signal propagation time of said inverters being defined as said first delay time;

said second delay means includes an OR gate whose signal propagation time is defined as said second delay time, and said second fixed value includes "0"; and said logical result output means includes a NOR gate and said first fixed value includes "0".

13. The counter circuit of claim 11 wherein, each input section and output section of said first to Nth flip-flops include non-inverted and inverted input sections and non-inverted and inverted output sections, respectively;

jth (j=1 to N) output signal includes one of ith non-inverted output signal from said non-inverted output section of jth flip-flop and ith inverted output signal from said inverted output section of said jth flip-flop; and said logical result output signal includes one of a non-inverted logical result output signal to be outputted to said non-inverted input section of said first flip-flop and an inverted logical result output signal to be outputted to said inverted input section of said first flip-flop.

14. The counter circuit of claim 13 wherein in said first to Nth non-inverted output signals and said first to Nth inverted output signals, one of jth (j=1 to N) non-inverted output signal and jth inverted output signal, which is capable of reducing the number of elements, is employed as jth output signal.

15. The counter circuit of claim 14 wherein,

N is equal to 3;

said first output signal includes a first non-inverted output signal, said second output signal includes a second inverted output signal, said third output signal includes a third non-inverted output signal, and said logical result output signal includes said non-inverted logical result output signal;

said first delay means includes a first stage inverter whose signal propagation time is defined as said first delay time;

said second delay means includes a NAND gate whose signal propagation time is defined as said second delay time, and said second fixed values includes "1"; and said logical result output means includes a NOR gate and said first fixed value includes "0".

16. The counter circuit of claim 14 wherein,

N is equal to 3;

said first output signal includes a first inverted output signal, said second output signal includes a second non-inverted output signal, said third output signal includes a third inverted output signal, and said logical result output signal includes said inverted logical result output signal;

said first delay means includes a first stage inverter whose signal propagation time is defined as said first delay time;

said second delay means includes a NOR gate whose signal propagation time is defined as said second delay time, and said second fixed values includes "0"; and said logical result output means includes a NAND gate and said first fixed value includes "1".

17. The counter circuit of claim 11 wherein the sum of said first to (N−1)th delay time is shorter than said predetermined clock cycle.

18. The counter circuit of claim 11 wherein the sum of said first to (N−1)th delay time is longer than said predetermined clock cycle and the sum of said second to (N−1)th delay time is shorter than said predetermined clock cycle.

19. The counter circuit of claim 11 wherein the sum of said first to (N−1)th delay time is shorter than the twice said predetermined clock cycle.

* * * * *